US008144528B2

(12) United States Patent
Oh

(10) Patent No.: US 8,144,528 B2
(45) Date of Patent: Mar. 27, 2012

(54) MEMORY WITH DATA CONTROL

(75) Inventor: HakJune Oh, Kanata (CA)

(73) Assignee: Mosaid Technologies Incorporated, Ottawa, ON ( * ) Notice: Subject to any disclaimer, the term of this patent is extended or adjusted under 35 U.S.C. 154(b) by 46 days.

(21) Appl. No.: 12/699,627

(22) Filed: Feb. 3, 2010

(65) Prior Publication Data
US 2010/0202224 A1 Aug. 12, 2010

Related U.S. Application Data

(63) Continuation of application No. 11/779,587, filed on Jul. 18, 2007, now Pat. No. 7,688,652.

(51) Int. Cl.
G11C 7/00 (2006.01)
(52) U.S. Cl. ........................................ 365/193; 365/233
(58) Field of Classification Search .............. 365/233 X, 365/193 O
See application file for complete search history.

(56) References Cited

U.S. PATENT DOCUMENTS

| 4,041,473 A | * | 8/1977 | Bardotti et al. ................. 710/63 |
|---|---|---|---|
| 4,174,536 A | | 11/1979 | Misunas et al. |
| 4,573,147 A | | 2/1986 | Aoyama et al. |
| 4,679,173 A | | 7/1987 | Sato |
| 4,796,231 A | | 1/1989 | Pinkham |
| 4,899,316 A | | 2/1990 | Nagami |
| 5,038,299 A | | 8/1991 | Maeda |
| 5,136,292 A | | 8/1992 | Ishida |
| 5,243,703 A | | 9/1993 | Farmwald et al. |
| 5,319,598 A | | 6/1994 | Aralis et al. |
| 5,336,951 A | | 8/1994 | Josephson et al. |
| 5,384,735 A | | 1/1995 | Park et al. |
| 5,430,859 A | | 7/1995 | Norman et al. |
| 5,452,259 A | | 9/1995 | McLaury |
| 5,473,577 A | | 12/1995 | Miyake et al. |
| 5,596,724 A | | 1/1997 | Mullins et al. |
| 5,768,212 A | | 6/1998 | Fujita |
| 5,771,199 A | | 6/1998 | Lee |
| 5,806,070 A | | 9/1998 | Norman et al. |

(Continued)

FOREIGN PATENT DOCUMENTS
WO WO 01/69411 A2 9/2001
(Continued)

OTHER PUBLICATIONS

Samsung Electronics Co. Ltd, "256M × 8 Bit / 128 M × 16 Bit / 512M × 8 Bit NAND Flash Memory", K9K4G08U1M, May 6, 2005, pp. 1-41.

(Continued)

Primary Examiner — VanThu Nguyen
(74) Attorney, Agent, or Firm — Chapin IP Law, LLC

(57) ABSTRACT

In an embodiment, a memory device comprises memory, a first data link, a first input, a second input, a second data link, a first output and a second output. The first data link is configured to input one or more packets into the memory device. The first input is configured to input command strobe signals into the memory device that delineate command packets that are input into the memory device via the first data link. The second input is configured to input data strobe signals into the memory device that delineate data packets that are input into the memory device via the first data link. The first and second outputs are configured to output the command strobe signal and data strobe signal, respectively. The second data link is configured to output packets from the memory device.

28 Claims, 17 Drawing Sheets

U.S. PATENT DOCUMENTS

| | | |
|---|---|---|
| 5,844,846 A | 12/1998 | Jang |
| 5,844,858 A | 12/1998 | Kyung |
| 5,872,994 A | 2/1999 | Akiyama et al. |
| 5,878,240 A | 3/1999 | Tomko |
| 5,938,750 A | 8/1999 | Shaberman |
| 5,959,890 A | 9/1999 | Yamamoto et al. |
| 5,964,857 A | 10/1999 | Srinivasan et al. |
| 6,064,627 A | 5/2000 | Sakurai |
| 6,091,660 A | 7/2000 | Sasaki et al. |
| 6,102,963 A | 8/2000 | Agrawal |
| 6,148,363 A | 11/2000 | Lofgren et al. |
| 6,215,726 B1 | 4/2001 | Kubo |
| 6,304,921 B1 | 10/2001 | Rooke |
| 6,317,812 B1 | 11/2001 | Lofgren et al. |
| 6,449,213 B1 | 9/2002 | Dodd et al. |
| 6,715,044 B2 | 3/2004 | Lofgren et al. |
| 6,763,426 B1 | 7/2004 | James et al. |
| 6,807,613 B1 | 10/2004 | Keeth et al. |
| 6,965,539 B2 | 11/2005 | Lee |
| 6,996,644 B2 | 2/2006 | Schoch et al. |
| 7,031,221 B2 | 4/2006 | Mooney et al. |
| 7,032,039 B2 | 4/2006 | DeCaro |
| 7,058,776 B2 | 6/2006 | Lee |
| 7,111,085 B2 | 9/2006 | Estakhri et al. |
| 7,130,958 B2 | 10/2006 | Chou et al. |
| 7,194,581 B2 | 3/2007 | Vogt |
| 7,202,545 B2 | 4/2007 | Perner |
| 7,239,576 B2 | 7/2007 | Shimbayashi |
| 7,245,553 B2 | 7/2007 | Lin et al. |
| 7,254,663 B2 | 8/2007 | Bartley et al. |
| 7,308,524 B2 * | 12/2007 | Grundy et al. ............... 711/103 |
| 7,334,070 B2 | 2/2008 | Borkenhagen |
| 7,433,258 B2 | 10/2008 | Rao et al. |
| 7,515,471 B2 | 4/2009 | Oh et al. |
| 7,836,340 B2 * | 11/2010 | Schuetz .......................... 714/25 |
| 7,889,578 B2 * | 2/2011 | Schuetz et al. ............... 365/193 |
| 7,894,294 B2 * | 2/2011 | Pyeon ..................... 365/230.03 |
| 2004/0001380 A1 | 1/2004 | Becca et al. |
| 2004/0019736 A1 | 1/2004 | Kim et al. |
| 2004/0039854 A1 | 2/2004 | Estakhri et al. |
| 2004/0148482 A1 | 7/2004 | Grundy et al. |
| 2004/0252689 A1 | 12/2004 | Park et al. |
| 2005/0073899 A1 | 4/2005 | Gallivan et al. |
| 2005/0138267 A1 | 6/2005 | Bains et al. |
| 2005/0160218 A1 | 7/2005 | See et al. |
| 2006/0020740 A1 | 1/2006 | Bartley et al. |
| 2006/0044872 A1 | 3/2006 | Nazarian |
| 2007/0076479 A1 | 4/2007 | Kim et al. |
| 2007/0153576 A1 | 7/2007 | Oh et al. |
| 2007/0165457 A1 | 7/2007 | Kim |
| 2008/0019189 A1 | 1/2008 | Lin |
| 2008/0049505 A1 * | 2/2008 | Kim et al. ............... 365/185.11 |
| 2008/0144411 A1 | 6/2008 | Tsem |
| 2008/0279003 A1 | 11/2008 | Kim et al. |
| 2009/0180483 A1 * | 7/2009 | Przybylski .................... 370/400 |
| 2010/0011174 A1 * | 1/2010 | Oh ................................ 711/154 |

FOREIGN PATENT DOCUMENTS

| | | |
|---|---|---|
| WO | 2007036047 A1 | 4/2007 |

OTHER PUBLICATIONS

Toshiba, "2GBIT (256M × 8 Bits) CMOS NAND E2PROM", TH58NVG1S3AFT05, May 19, 2003, pp. 1-32.

Atmel Corp., "High Speed Small Sectored SPI Flash Memory", pp. 1-23, 2006.

King, et al., "Communicating with Daisy Chained MCP42XXX Digital Potentiometers", Microchip AN747, pp. 1-8, 2001.

Intel Corporation, "Intel® Advanced+ Boot Block Flash Memory (C3)", May 2005, pp. 1-72.

M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.

Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.

"HyperTransport TM I/O Link Specification", Revision 2.00, Document No. HTC20031217-0036-0010, Hypertransport Technology Consortium, pp. 1-325, Apr. 27, 2005.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. 1-98, (Mar. 1996).

Oshima, et al., "High-Speed Memory Architectures for Multimedia Applications", Circuits & Devices, IEEE 8755-3996/97, pp. 8-13, Jan. 1997.

Diamond, S.L., "SyncLink: High: High-speed DRAM for the Future", Micro Standards, IEEE Micro, pp. 74-75, Dec. 1996.

"HyperTransport TM I/O Link Specification", Revision 3.00, Document No. HTC20051222-0046-0008, Hypertransport Technology Consortium, pp. 1-428, Apr. 21, 2006.

International Search Report, Form PCT/ISA/210, pp. 1, Oct. 2008.

Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, vol. 1, pp. 1-10, 2004.

Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, vol. 1, pp. 1-8, 2004.

Samsung Electronics, "DDR2 Fully Buffered DIMM 240pin FBDIMMS based on 512Mb C-die" Rev. 1.3, Sep. 2006, pp. 1-32, Sep. 2006.

Atmel, "8-megabit 2.5-volt Only or 2.7-volt Only DataFlash®," Technical Specification, Atmel, Rev. 2225H-DFLSH pp. 1-33, (2004).

The I2C-Bus Specification, Version 2.1, Philips Semiconductors, pp. 1-46, Jan. 2000.

M25p20, "2Mbit, Low Voltage, Serial Flash Memory with 40 Mhz SPI Bus Interface," Technical Specification, STMicroelectronics Group of Companies, pp. 1-40, Aug. 2005.

Microchip Technology Inc., "Microchip Product Description 24AA1025/24LC1025/24FC1025", pp. 1-22, 2006.

Silicon Storage Technology, Inc. "SSTs 16Mbit SPI Serial Flash (SST25VF016B__16Mbit SPI Serial Flash.pdf)", pp. 1-28, 2005.

Samsung Electronics, "K9XXG08UXM Preliminary Flash Memory," Technical Specification, Samsung Electronics, 43 pages.

Atmel, "Two-wire Serial EEPROM", pp. 1-26, 2006.

Kim, et al., United States Patent and Trademark Office, Office Action for U.S. Appl. No. 12/179,835, communication dated Jan. 13, 2010, pp. 1-6.

Pyeon, et al., United States Patent and Trademark Office, Notice of Allowance for U.S. Appl. No. 11/496,278, communication dated Sep. 21, 2009, pp. 1-11.

Pyeon, et al., United States Patent and Trademark Office, Office Action for U.S. Appl. No. 11/496,278, communication dated May 14, 2009, pp. 1-14.

Pyeon, et al., United States Patent and Trademark Office, Final Office Action for U.S. Appl. No. 11/496,278, communication dated Dec. 31, 2008, pp. 1-13.

Pyeon, et al., United States Patent and Trademark Office, Office Action for U.S. Appl. No. 11/496,278, communication dated Jun. 30, 2008, pp. 1-15.

Pyeon, et al., United States Patent and Trademark Office, Office Action for U.S. Appl. No. 11/594,564, communication dated Sep. 2, 2009, pp. 1-14.

Pyeon, et al., United States Patent and Trademark Office, Final Office Action for U.S. Appl. No. 11/594,564, communication dated Jun. 1, 2009, pp. 1-15.

Pyeon, et al., United States Patent and Trademark Office, Office Action for U.S. Appl. No. 11/594,564, communication dated Dec. 1, 2008, pp. 1-15.

Oh, et al., United States Patent and Trademark Office, Notice of Allowance for U.S. Appl. No. 11/583,354, communication dated Oct. 10, 2008, pp. 1-5.

Oh, et al. United States Patent and Trademark Office, Office Action for U.S. Appl. No. 11/583,354, communication dated Apr. 9, 2008, pp. 1-11.

Oh, et al., Notice of Allowance from United States Patent and Trademark Office for U.S. Appl. No. 12/275,701, communication dated Jun. 16, 2010, pp. 1-6.

Oh, et al., Office Action from United States Patent and Trademark Office for U.S. Appl. No. 12/275,701, communication dated Jul. 10, 2009, pp. 1-8.

Pyeon, et al., Office Action from United States Patent and Trademark Office for U.S. Appl. No. 11/496,278, communication dated Jul. 22, 2010, pp. 1-16.

Kim, et al., Notice of Allowance from United States Patent and Trademark Office for U.S. Appl. No. 12/179,835, communication dated Mar. 23, 2010, pp. 1-8.

Oh, et al., Notice of Allowance from United States Patent and Trademark Office for U.S. Appl. No. 12/275,701, communication dated Feb. 23, 2010, pp. 1-4.

Pyeon, et al., Office Action from United States Patent and Trademark Office for U.S. Appl. No. 11/594,564, communication dated Apr. 1, 2010, pp. 1-14.

Pyeon, et al., Office Action from United States Patent and Trademark Office for U.S. Appl. No. 11/496,278, communication dated Feb. 18, 2010, pp. 1-15.

* cited by examiner

US 8,144,528 B2

MEMORY WITH DATA CONTROL

RELATED APPLICATIONS

This application is a continuation application claiming priority to earlier filed U.S. patent application Ser. No. 11/779,587 entitled (as amended) "Storage of Data in Memory Via Packet Strobing," filed on Jul. 18, 2007, now U.S. Pat. No. 7,688,652 the entire teachings of which are incorporated herein by this reference.

BACKGROUND

Today, many electronic devices include memory systems that are used to store information (data) utilized by the devices. For example, some digital audio players include memory systems that are used to store digitized audio that may be played by the players. Likewise, personal computer systems often employ memory systems to store software utilized by the computer systems.

In many electronic devices, memory systems often comprise a controller and one or more memory devices. The controller typically contains circuitry configured to generate signals that are used to direct the memory devices to store and retrieve information. The memory devices typically store the information in memory that is contained in the memory devices. The memory may be volatile or non-volatile. A memory device that contains volatile memory often loses the stored information when power is removed from the device. A memory device containing non-volatile memory often retains the stored information even when power is removed from the device.

In certain conventional memory systems, data and control signals are transferred between the controller and memory devices in parallel using a parallel bus. Often, many wires are used to implement the bus and, depending on the layout of the memory system, the wires may extend for some length.

BRIEF DESCRIPTION OF THE DRAWINGS

Reference will now be made, by way of example, to the accompanying drawings of which.

DETAILED DESCRIPTION OF ILLUSTRATED EMBODIMENTS

Figure 1:
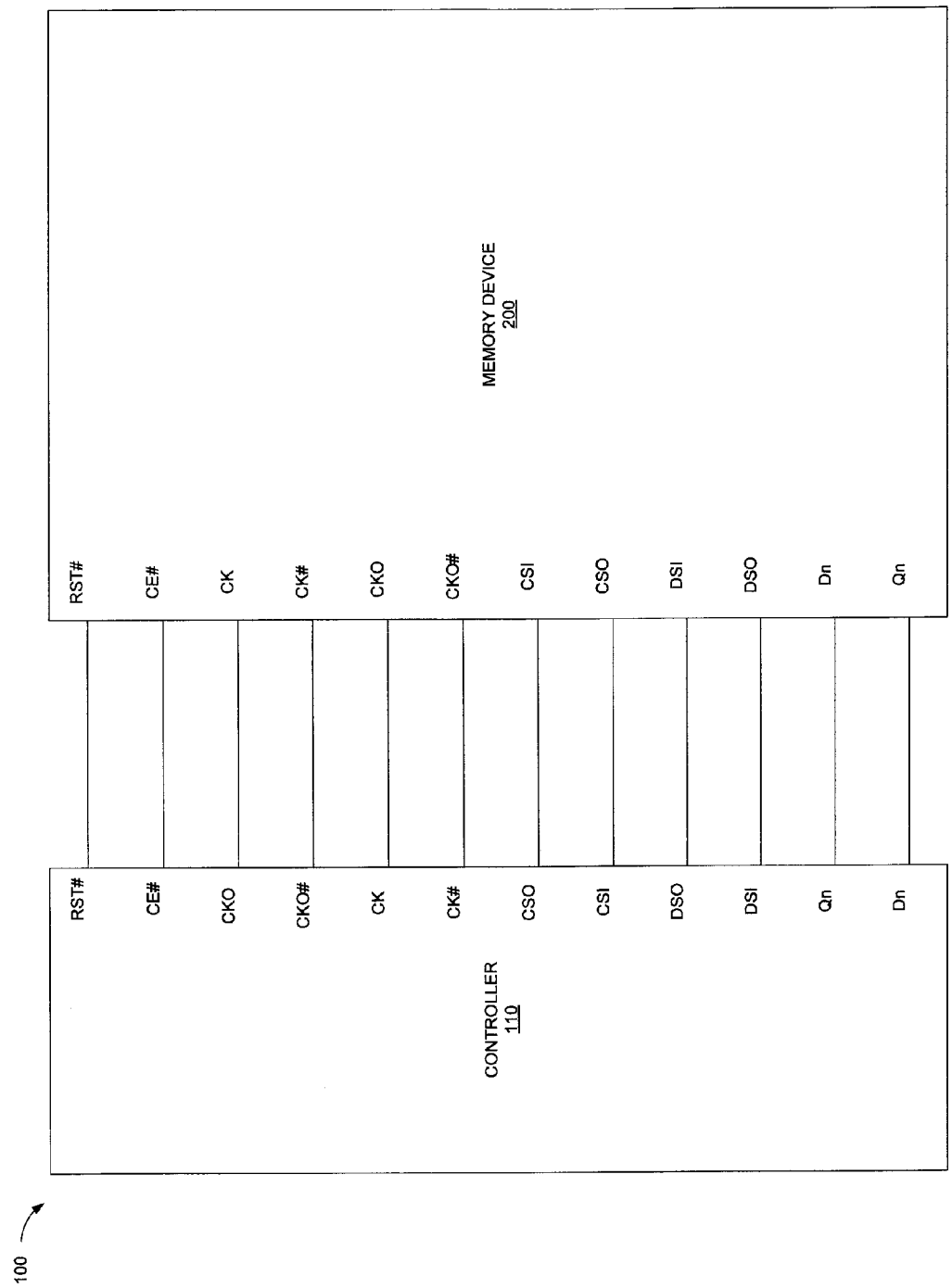
FIG. 1 is a block diagram of an example of a memory system that may be used with an embodiment of the invention.

In some serial bus designs, commands are used to direct the memory devices to perform various operations (e.g., read data, write data). The commands are typically embedded in a serial data stream that is transferred from a controller to the memory devices via a serial bus. Parameters that are associated with the command (e.g., addresses, data) may also be included in the serial stream. The command and parameter information may be "tagged" with codes so that they may be identified by the memory devices. For example, a two-bit code may precede a command in the serial stream to indicate that the information following the code is a command. Likewise, data and address information may each be preceded in the stream with codes to identify this information.

One problem with the above-described serial bus design is that the codes in the serial bit stream tend to add a significant amount of overhead to the command and parameter information carried in the stream. For example, if a two-bit code is used to identify a 4-bit command, the overhead added by the code is fifty percent. Moreover, adding the codes to the bit stream may impact performance and consume valuable space in the bit stream that may be otherwise used to carry other information, such as additional commands and their associated parameters as well as additional data.

An improved design for inputting and outputting information into and from a memory device, respectively, is disclosed herein. In an embodiment, a memory device comprises memory, a first data link, a first input, a second input, a second data link, a first output and a second output. The first data link is configured to input one or more packets into the memory device. A packet relates to a sequence of data (e.g., bytes of data) that may be formatted to contain various information, such as commands, parameters, data and so on. The first input is configured to input a command strobe signal into the memory device. The command strobe signal delineates a command packet (i.e., indicates the start and end of the packet) that is input into the memory device at the first data link. A command packet is illustratively a packet that contains a command that may be executed by the memory device. The command packet may also contain various parameter information associated with the command, such as address information. The second input is configured to input a data strobe signal into the memory device. The data strobe signal delineates a write data packet that is input into the memory device at the first data link. A write data packet is illustratively a packet that contains data that may be stored in the device's memory. The second data link is configured to output information, such as packets and status, from the memory device. Packets that are output from the device may include command packets that are bypassed by the device and read data packets. A read data packet is illustratively a packet that contains data that may have been read from the device's memory. The first output is configured to output a command strobe signal that is bypassed by the memory device. Likewise, the second output is configured to output a data strobe signal that is bypassed by the memory device. Bypassed command packets are illustratively output from the device simultaneously with bypassed command strobe signals which delineate the command packets. Likewise, read data packets are illustratively output from the memory device simultaneously with bypassed data strobe signals which delineate the read data packets.

FIG. 1 is a block diagram of an example of a memory system that may be used with an embodiment of the invention. System 100 comprises a controller 110 connected to a memory device 200 via a series of electrical connections. The controller 110 comprises circuitry configured to generate various control signals and packets that are used to store data in the memory device 200 and retrieve stored data from the device 200. The control signals and packets are transferred between the memory device 200 and the controller 110 via the electrical connections. The packets may include command packets that contain commands and associated parameters that are used, for example, to direct the memory device 200 to store data into and retrieve data from memory contained in the device 200. In addition, the packets may include write data packets that contain data that are to be stored in the memory and read data packets that contain data that have been retrieved from the memory.

It should be noted that concepts disclosed herein may be applied to many different types of memory devices including, but not limited to, NAND flash memory, NOR flash memory, AND flash memory, serial flash memory, Divided Bit-line NOR (DiNOR) flash memory, Dynamic Random Access Memory (DRAM), Synchronous RAM (SRAM), Ferro-electric RAM (FRAM), Magnetic RAM (MRAM), Phase Change RAM (PCRAM), Read Only Memory (ROM), Electrically Erasable Programmable ROM (EEPROM) and so on.

Figure 2:
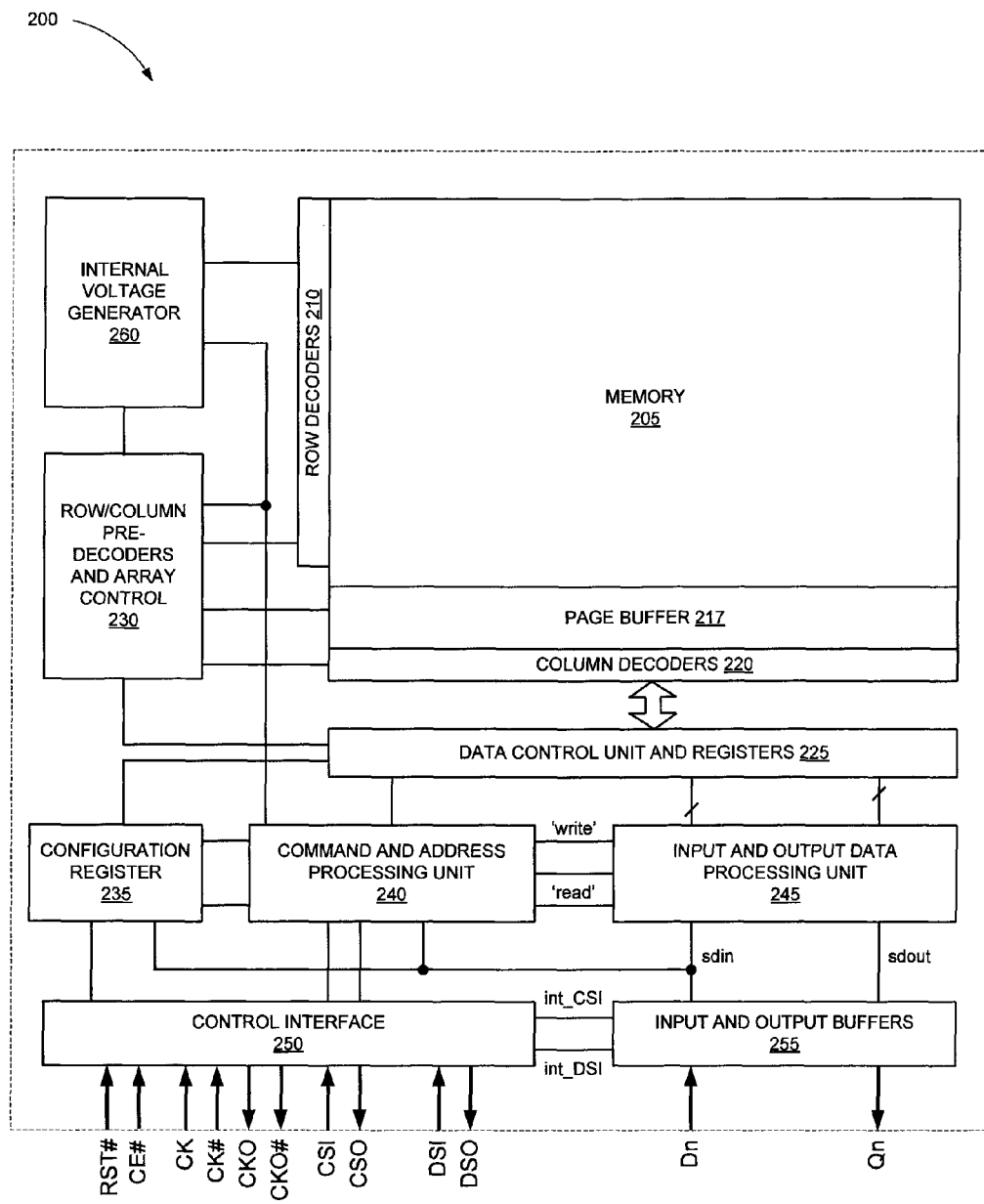
FIG. 2 is a block diagram of an example of a memory device that may implement an embodiment of the invention.

FIG. 2 is a block diagram of an example of a memory device 200 that may implement an embodiment of the invention. Memory device 200 comprises various circuitry including circuitry configured to store and retrieve data in response to commands that are input into the device 200. More specifically, memory device 200 comprises an internal voltage generator 260, a row/column pre-decoder and array control 230, row decoders 210, page buffer 217, memory 205, column decoders 220, data control unit and registers 225, configuration register 235, command and address processing unit 240, input and output data processing unit 245, control interface 250 and input and output buffers 255.

The internal voltage generator 260 comprises circuitry configured to generate various voltage levels used by various circuitry contained in the memory device 200. The row/column pre-decoders and array control 230 comprise circuitry configured to pre-decode row address and column address information that is transferred from the command and address processing unit 240.

The row decoders 210 comprise circuitry configured to perform final decoding of row address information provided by the row/column pre-decoders 230. The final decoded row address information is used to select a location in memory 205 were data is to be stored or retrieved. The column decoders 220 comprise circuitry configured to perform final decoding of column address information provided by the row/column pre-decoders 230. The final decoded column address information is used to select a specific column in the page buffer 217. The data control unit and registers 225 comprise circuitry configured to process and store information that is transferred to and from the page buffer 217. The page buffer 217 is a data buffer that comprises circuitry configured to temporarily hold (1) write data that is to be stored into memory 205 and (2) read data that is retrieved from memory 205.

Memory 205 comprises circuitry configured to implement a data storage that may be used to store data. Memory 205 may include one or more memory banks that are used to store the data. The memory 205 may be volatile or non-volatile. Data is illustratively stored (written) into and retrieved (read) from memory 205 on a per page basis. In device 200, a page is 2112 bytes in length. It should be noted that other page sizes are used in other embodiments of the invention. It should be also noted that in other embodiments of the invention, data is stored and retrieved from memory on a non-page basis.

The configuration register 235 comprises circuitry configured to store various configurable (programmable) and/or read-only configuration information associated with the device 200. This information illustratively includes a device address that is associated with the memory device 200 and link-width information that specifies a width of the device's Dn input data link and the device's Qn output data link. In an embodiment, the link width information specifies the number of bits of information that may be simultaneously clocked into the device 200 at the Dn input or clocked out of the device 200 at the Qn output. For example, if the specified link width is one bit, then one bit of information may be clocked into the Dn input or clocked out of the Qn output at a time. Likewise, for example, if the specified link width is eight bits, then eight bits of information may be clocked into the Dn input or clocked out of the Qn output at a time.

The command and address processing unit 240 comprises circuitry configured to process commands contained in command packets that are input into the device 200. This processing illustratively includes executing the commands and processing (e.g., decoding) row and column address information from address information that may be contained in the command packets. The processed row and column information is transferred by the command and address processing unit 240 to the row/column pre-decoders and array control 230 to, inter alia, select various locations in memory 205 where data is stored and retrieved. The input and output data processing unit 245 comprises circuitry configured to process data transferred to and from the device 200. This processing illustratively includes serializing and de-serializing the data.

Control interface 250 comprises circuitry configured to implement various inputs and outputs of the device 200. The inputs include an RST# input, CE# input, CK input, CK# input, CSI input and DSI input. The outputs include a CSO output, a DSO output, an optional CKO output and an optional CKO# output. Signals that may be input into the device 200 include a reset signal, a chip enable signal, a clock input signal and its inverse, a command strobe signal and a data strobe signal which are input into the device 200 via the device's RST#, CE#, CK, CK#, CSI and DSI inputs, respectively. Signals that may be output from the device 200 include a clock output signal and its inverse, a command strobe signal and a data strobe signal which are output from the device 200 via the device's CKO, CKO#, CSO, and DSO outputs, respectively.

The reset signal may be used to reset the device 200. Inputting an activated reset signal (e.g., setting the signal to a logical low state) into the device 200 at the device's RST# input causes the device 200 to reset. The chip enable signal may be used to enable the device 200. Inputting an activated chip enable signal into the device 200 at the device's CE# input causes the device 200 to be enabled (operative). Enabling a device 200 activates internal clock signals in the device 200 and makes the device 200 capable of accepting and processing commands. Inputting a deactivated chip enable signal into the device 200 at the device's CE# input disables the device 200, deactivates the device's internal clock signals and makes the device 200 inoperative (e.g., incapable of accepting and processing commands).

The clock input signal and its inverse are external system clock signals that may be used to provide an external clock to the device 200. In an embodiment, the clock input signal and its inverse are differential clock signals meaning that one is the complement of the other. Command and data packets may be synchronously input into or output from the device 200 using the clock input signal or its inverse. Likewise, status may be synchronously output from the device using the clock input signal or its inverse. The clock output signal and its inverse are copies of the clock input signal and its inverse, respectively.

As will be described further below, a command strobe signal that is inputted into a device 200 may be used to delineate a command packet that is inputted into the device 200 at the device's Dn input. A command strobe signal that is outputted from a device 200 is a copy of a command strobe signal that is inputted into the device 200. A command strobe signal that is outputted from a device 200 may be used to delineate a command packet that is output (bypassed) by the device 200 at the device's Qn output. A data strobe signal that is inputted into a device 200 may be used to delineate a write data packet that is inputted into the device 200 at the device's Dn input. A data strobe signal that is outputted from a device 200 is a copy of a data strobe signal that is inputted into the device 200. A data strobe signal that is outputted from a device 200 may be used to delineate a read data packet that is output from the device 200 at the device's Qn output. In addition, a data strobe signal that is outputted from a device 200 may be used to indicate status is output from the device 200 at the device's Qn output.

The Dn input is a data link that is used to input packets (e.g., write data packets, command packets) into the device 200. A packet is illustratively input into the device 200 at the Dn input by clocking a portion of the packet into the device 200 at a transition of the clock input signal or its inverse. The size of the portion that is clocked into the device 200 at a time depends on the width of the data link as specified in the configuration register 235. For example, if the data link is specified as being one bit wide, then the size of the portion is one bit and one bit of the packet is clocked into the device 200 at a time. Likewise, for example, if the data link width is eight bits wide, then the size of the portion is eight bits and eight bits of the packet are clocked into the device at a time.

The transition of the clock signal that is used to clock the portion of the packet into the device 200 depends on the data rate arrangement used for the device 200. For example, in a single data rate (SDR) arrangement, a portion of the packet may be clocked into the device 200 at each upward or downward transition of CK or CK#. Likewise, in a double data rate (DDR) arrangement, a portion of the packet may be clocked into device 200 at each upward and downward transition of CK or CK#. Note that other data rate arrangements may be used with the device 200 including a quad data rate (QDR) arrangement, an octa data rate (ODR) arrangement and so on.

The Qn output is a data link that is used to output information (e.g., bypassed command packets, read data packets, status) from the memory device 200. The amount of information that is output from the device 200 at a time (e.g., at a transition of the clock input signal or its inverse) depends on the width of the data link. Thus, for example, if the data link is one bit wide then a single bit of information is output from the device 200 at a time. Likewise, if the width of the data link is multiple bits wide, then multiple bits of information are output from the device 200 at a time.

Information is illustratively output from the device 200 at the Qn output by clocking a portion of the information out of the device 200 at a transition of the clock input signal or its inverse. The amount of information that is clocked out of the device 200 at a time depends on the width of the data link as specified in the configuration register 235. For example, if the data link is one bit wide, then one bit of information is clocked out of the device 200 at a time. Likewise, for example, if the data link width is eight bits wide, then eight bits of information are clocked out of the device 200 at a time.

The transition of the clock signal that is used to clock the information out of the device 200 depends on the data rate arrangement used for the device 200. For example, in an SDR arrangement, a portion of the information may be clocked out of the device 200 at each upward or downward transition of CK or CK#. Likewise, in a DDR arrangement, a portion of the information may be clocked out of the device 200 at each upward and downward transition of CK or CK#. Note that other data rate arrangements may be used to clock information out of the device 200 including a QDR arrangement, an ODR arrangement and so on.

The CSI, DSI and Dn inputs and, the CSO, DSO and Qn outputs together comprise a serial link interface for device 200. It should be noted that the device 200 may contain one or more serial link interfaces and the serial link interfaces may operate independently of each other.

Operationally, the control interface 250 receives an activated command strobe signal at the device's CSI input, generates an internal command strobe signal (int_CSI), from the activated command strobe signal and transfers the internal command strobe signal to the input and output buffers 255 to condition the buffers 255 to receive (clock in) a command packet at the device's Dn input. The input and output buffers 255 clock the command packet into the device 200 and transfer the command packet to the command and address processing unit 240 via an internal serial "data in" (sdin) bus.

The command and address processing unit 240 processes the command packet including parsing address information that may be contained in the packet and executing a command contained in the packet. The command and processing unit 240 transfers the parsed address information to the row/column pre-decoders and array control 230. If the parsed address information contains a row address, the row/column pre-decoders and array control 230 transfers the row address to the row decoders 210 which select a page in memory 205 associated with the row address. If the parsed address information contains a column address, the row/column pre-decoders and array control 230 transfers the column address to the column decoders 220 which select a starting column in the page buffer 217 associated with the column address.

If a command packet received by the device 200 contains (1) a column address and (2) a burst data load start command or a burst data load command, the command and address processing unit 240 places the device 200 in a write mode by generating a write signal and transferring the write signal to the input and output data processing unit 245 to direct the unit 245 to receive a write data packet containing write data that is to be written into memory 205. In addition, the command and address processing unit 240 transfers the column address contained in the command packet to the row/column pre-decoders and array control 230 to select a starting column in the page buffer 217 where the write data is to be written.

After the device 200 has been placed in the write mode, a data strobe signal that is received at the device's DSI input is converted into an internal data strobe signal (int_DSI) by the control interface 250. The control interface 250 then transfers the internal data strobe signal to the input and output buffers 255 to direct the buffers 255 to receive the write data packet. The input and output buffers 255 receive (clock in) the write data packet at the device's Dn input and transfer the write data packet to the input and output data processing unit 245 via the sdin bus. The input and output data processing unit 245 de-serializes the write data packet and transfers the write data contained therein to the data control unit and registers 225. The data control unit and registers 225 transfer the write data to the page buffer 217 starting at the column address selected by the column decoders 220.

A command packet containing a page program command and a row address that is later received by the device 200 is transferred to the command and address processing unit 240 which (1) executes the page program command, (2) transfers the row address to the row/column pre-decoders and array control 230 to select a page in memory 205 where the write data is to be written and (3) directs the data control unit and registers 225 to write the write data contained in the page buffer 217 into the selected page in memory 205.

If a command packet, received by the device 200, contains a page read command, the command and address processing unit 240 generates a read signal and transfers the read signal to the input and output data processing unit 245. In addition, the command and address processing unit 240 transfers a row address contained in the command packet to the row/column pre-decoders and array control 230 to select a row in memory where the read data is stored. The read data at the selected row is read from memory 205 and placed in the page buffer 217. The input and output data processing unit 245 serializes the read data and transfers the serialized read data to the input and output buffers 255 via an internal serial "data out" (sdout) bus.

A command packet containing a burst data read command and a column address that is later received by the device 200 is transferred to the command and address processing unit 240 which (1) executes the burst data read command and (2) places the device 200 in a read mode by generating a read signal and transferring the read signal to the input and output data processing unit 245 to direct the unit 245 to output the read data to the input and output buffers 255. The input and output data processing unit 245 receives the read signal, serializes the read data and transfers the serialized read data to the input and output buffers 255.

After the device 200 has been placed in the read mode, a data strobe signal received at the device's DSI input is converted into an internal data strobe signal (int_DSI) by the control interface 250. The control interface 250 transfers the internal data strobe signal to the input and output buffers 255 to direct the buffers 255 to output the serialized read data. The input and output buffers 255 output (clock out) the serialized read data from the device 200 at the device's Qn output.

Table 1 illustrates an example of information that may be contained in a command packet that is input into a device 200.

TABLE 1

Example Command Packet Information

| Command/Operation | Device Address | OP Code | Row Address | Column Address |
|---|---|---|---|---|
| Page Read | Valid | 00h | Valid | — |
| Page Read for Copy | Valid | 10h | Valid | — |
| Burst Data Read | Valid | 20h | — | Valid |
| Burst Data Load Start | Valid | 40h | — | Valid |
| Burst Data Load | Valid | 50h | — | Valid |
| Page Program | Valid | 60h | Valid | — |
| Block Erase Address Input | Valid | 80h | Valid | — |
| Page-pair Erase Address Input | Valid | 90h | Valid | — |
| Erase | Valid | A0h | — | — |
| Operation Abort | Valid | C0h | — | — |
| Read Status Register | Valid | F0h | — | — |
| Read Device Information Register | Valid | F4h | — | — |
| Read Link Configuration Register | Valid | F7h | — | — |
| Write Link Configuration Register | Valid | FFh | — | — |

The device address is used to a address command packet to one or more devices 200 in a system. The device address may be a unicast address that is used to address the command packet to a particular device 200. Alternatively, the address may be a multicast address that is used to address the command packet to one or more devices 200 that belong to a particular multicast group. A device 200 that receives a command packet that is (1) addressed to the device 200 or (2) addressed to a multicast group to which the device 200 belongs performs (executes) the command contained in the command packet. In a single device 200 system, the device address may be omitted. In a multiple device 200 system, the device address may be necessary in order to identify those devices 200 in the system that are to perform the command.

The command is used to direct the device 200 to perform a particular operation. For example, a page read command may be used to direct the device 200 to read a page of data from the device's memory 205 and place the data in the device's page buffer 217. Likewise, a burst data read command may be used to direct the device 200 to output data contained in the device's page buffer 217 from the device 200 at the device's Qn output. A command is represented in a command packet by an operation (OP) code.

The row address is used to specify a starting memory location contained in memory 205 where the command is to be performed. For example, for a page read command, the row address specifies a starting address of a page in memory 205 where data is read.

The column address specifies a starting address of a column in the page buffer 217 where the operation is performed. For example, for a burst data read command, the column address specifies a starting column in the page buffer 217 where data is read.

Table 2 illustrates example formats that may be used to format a command packet that is input into a device 200.

TABLE 2

Example Command Packet Formats

| Command/Operation | 1$^{st}$ Byte | 2$^{nd}$ Byte | 3$^{rd}$ Byte | 4$^{th}$ Byte | 5$^{th}$ Byte |
|---|---|---|---|---|---|
| Page Read | DA | 00h | RA | RA | RA |
| Page Read for Copy | DA | 10h | RA | RA | RA |

TABLE 2-continued

Example Command Packet Formats

| Command/Operation | 1st Byte | 2nd Byte | 3rd Byte | 4th Byte | 5th Byte |
|---|---|---|---|---|---|
| Burst Data Read | DA | 20h | CA | CA | — |
| Burst Data Load Start | DA | 40h | CA | CA | — |
| Burst Data Load | DA | 50h | CA | CA | — |
| Page Program | DA | 60h | RA | RA | RA |
| Block Erase Address Input | DA | 80h | RA | RA | RA |
| Page-pair Erase Address Input | DA | 90h | RA | RA | RA |
| Erase | DA | A0h | — | — | — |
| Operation Abort | DA | C0h | — | — | — |
| Read Status Register | DA | F0h | — | — | — |
| Read Device Information Register | DA | F4h | — | — | — |
| Read Link Configuration Register | DA | F7h | — | — | — |
| Write Link Configuration Register | DA | FFh | — | — | — |

For example, referring to Table 2, a command packet that may be used to direct a device 200 to perform a page read operation may contain a one-byte device address (DA) associated with the device 200, followed by a one-byte OP code (i.e., 00h) that indicates a page read command and followed by a three-byte row address (RA) which specifies a row address associated with the command. Likewise, for example, a command packet that may be used to direct a device 200 to perform a burst data read operation may contain a one-byte device address associated with the device 200, followed by a one-byte OP code (i.e., 20h) that indicates a burst data read command and followed by a two-byte column address (CA) which specifies a column address associated with the command.

Figure 3:
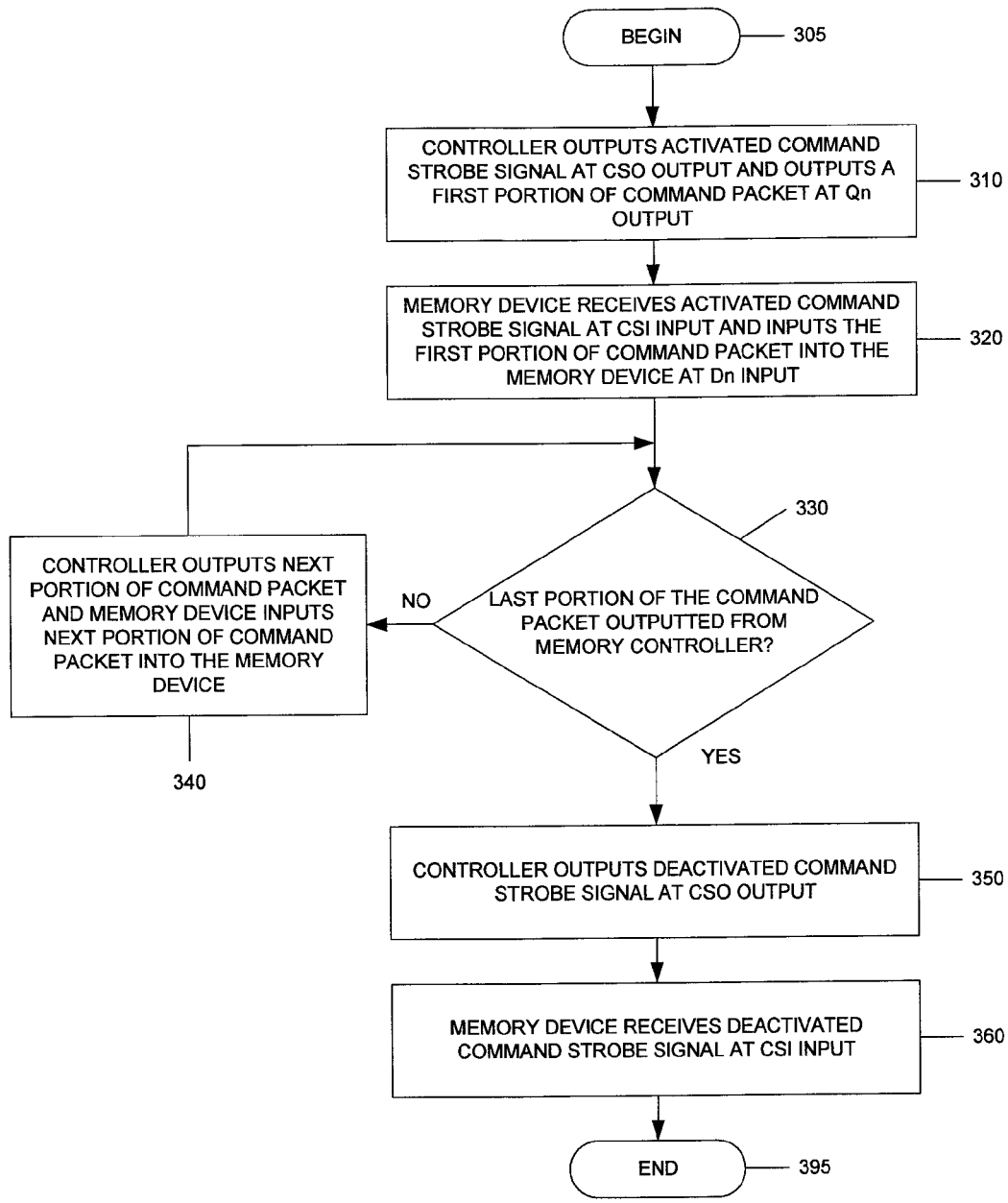
FIG. 3 is a flow chart of a sequence of steps that may be used to input a command packet into a memory device in accordance with an embodiment of the invention.

FIG. 3 is a flow chart of a sequence of steps that may be used to input a command packet into the memory device 200 in system 100 in accordance with an embodiment of the invention. Referring to FIGS. 1 and 3, the sequence begins at step 305 and proceeds to step 310 where the controller 110 outputs (1) an activated command strobe signal at the controller's CSO output and (2) a first portion of the command packet at the controller's Qn output. At step 320, the memory device 200 receives the command strobe signal at its CSI input and inputs (clocks) the first portion of the command packet into the device 200 at its Dn input, as described above. At step 330, the controller 110 determines if the last portion of the command packet has been outputted from the memory controller 110. If not, the sequence proceeds to step 340 where the controller 110 outputs the next portion of the command packet and the memory device inputs 200 the next portion into the device 200, as described above.

If at step 330, the controller 110 determines that the last portion of the command packet has been outputted from the controller 110, the sequence proceeds to step 350 where the controller outputs a deactivated command strobe signal at its CSO output to indicate the end of the command packet. At step 360, the memory device 200 receives the deactivated command strobe signal at its CSI input and concludes the entire command packet has been input into the device 200. The sequence ends at step 395.

Figure 4:
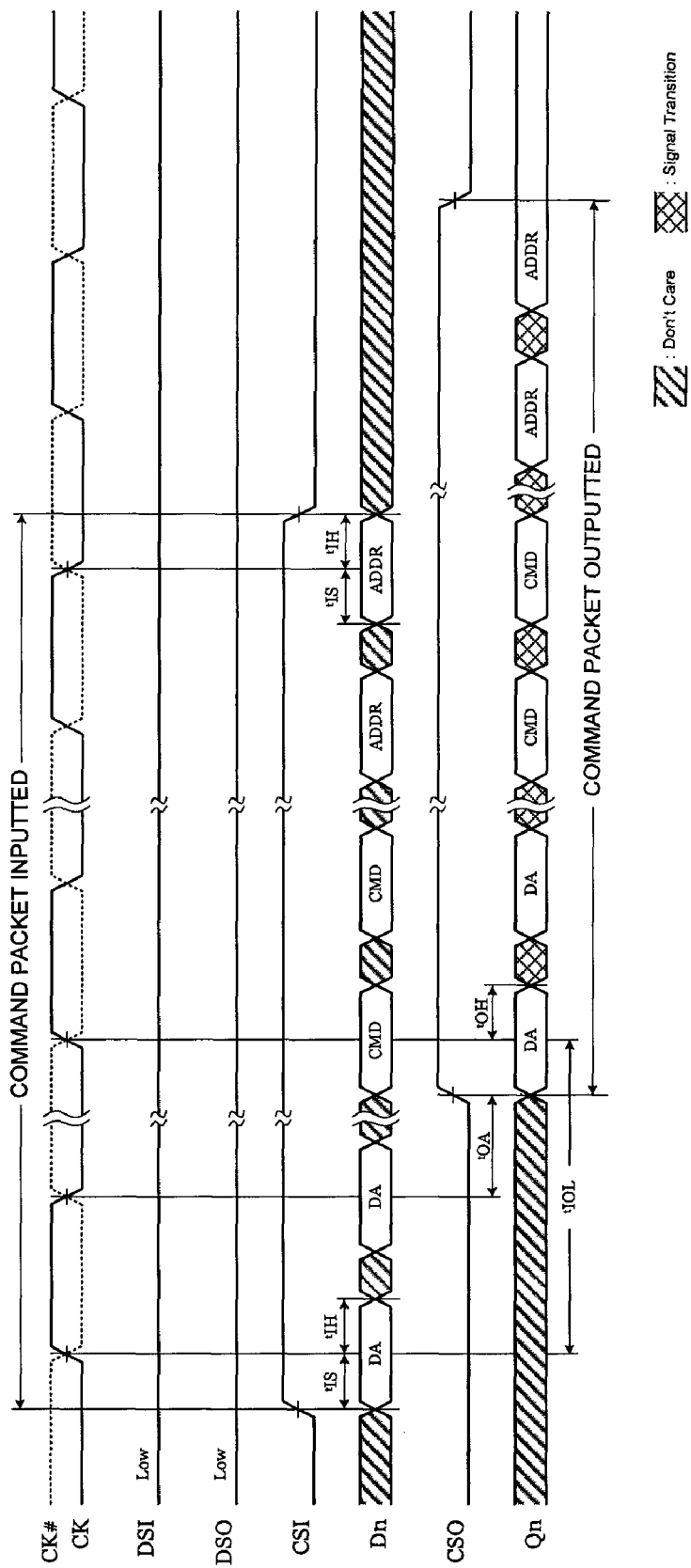
FIG. 4 is a timing diagram that illustrates timing information that may be used to input a command packet into a memory device in accordance with an embodiment of the invention.

FIG. 4 is a timing diagram that illustrates timing information that may be used to input a command packet into a memory device 200 in accordance with an embodiment of the invention. Referring to FIG. 4, the command packet contains device address (DA), command (CMD) and address (ADDR) information. An activated command strobe signal is input into the memory device 200 at the device's CSI input. While the command strobe signal is activated, a portion of the command packet present at the device's Dn input is clocked into the device 200 at a clock edge associated with the clock signal that is present at the CK or CK# inputs. Subsequent portions of the command packet are clocked into the device 200 at subsequent clock transitions. As noted above, the number of bits of the command packet that comprise the portion depends on the width of Dn specified in the configuration register 235.

Time $'IS$ represents an input setup time and time $'IH$ represents an input hold time for the portion of the command packet that is presented at the Dn input. The command strobe signal is activated for the duration of the command packet and is used to delineate the command packet. The command strobe signal is deactivated after the last portion of the command packet has been clocked into the device 200.

The device 200 bypasses the command strobe signal by outputting a copy of the command strobe signal at the device's CSO output at a time $'IOL$ (input/output latency time) which is a latency time from the time the command strobe signal was input into the device 200. While the activated command strobe signal is output from the device 200, device 200 bypasses the command packet by clocking the command packet out of the device 200 portion-by-portion, as described above, at the device's Qn output at each edge of a clock signal that is present at the CK or CK# inputs. The number of bits that comprise the portion depends on the width of Qn specified in the configuration register 235, as described above. The time $'OH$ represents a hold time where the information outputted at the Qn output is valid. The time $'OA$ represents an output access time.

In an embodiment, a command packet is some multiple of bytes in length and each byte may be input into the device 200 using four clock cycles. In this embodiment, the activated command strobe signal is present at the device's CSI input and CSO output for some multiple of four clock cycles for each command packet depending on the length of the command packet. If, for example, the command packet is five bytes in length, the activated command strobe signal is present at the device's CSI input and CSO output for twenty clock cycles each.

Figure 5:
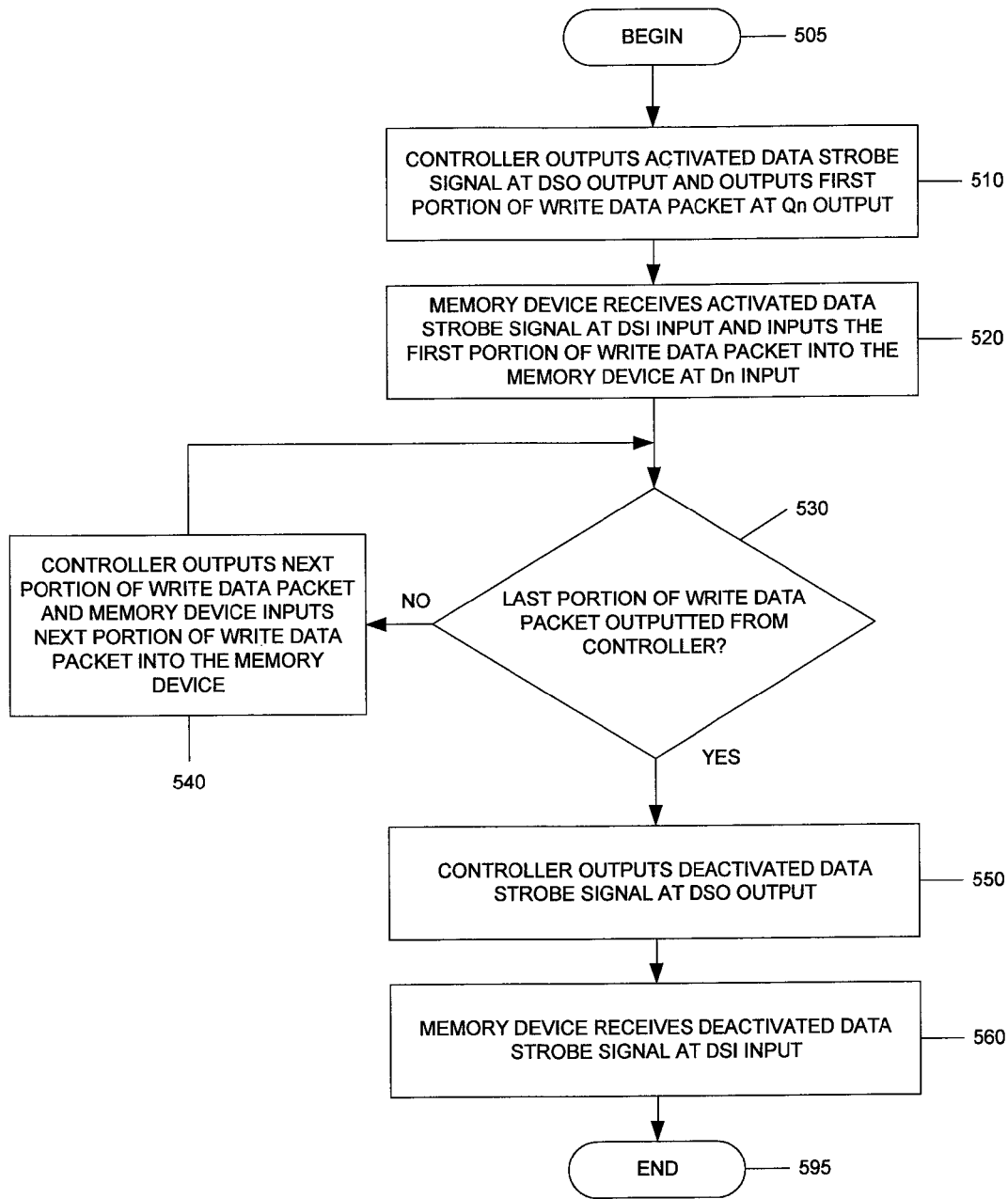
FIG. 5 is a flow chart of a sequence of steps that may be used to input a write data packet into a memory device in accordance with an embodiment of the invention.

FIG. 5 is a flow chart of a sequence of steps that may be used to input a write data packet into the memory device 200 in system 100 in accordance with an embodiment of the invention. Referring to FIGS. 1 and 5, the sequence begins at step 505 and proceeds to step 510 where the controller 110 outputs an activated data strobe signal at the controller's DSO output and outputs a first portion of the write data packet at the controller's Qn output. At step 520, the memory device 200 receives the activated data strobe signal at the device's DSI input and inputs the first portion of the write data packet into the device 200 at the device's Dn input, as described above. At step 530, the controller 110 determines if the last portion of the write data packet has been outputted from the memory controller 110. If not, the sequence proceeds to step 540 where the controller 110 outputs the next portion of the write data packet and the memory device 200 inputs the next portion into the device 200, as described above.

If at step 530, the controller 110 determines that the last portion of the write data packet has been outputted from the memory controller 110, the sequence proceeds to step 550 where the controller outputs a deactivated data strobe signal at the controller's DSO output to indicate the end of the write data packet. At step 560, the memory device 200 receives the deactivated data strobe signal at the device's DSI input and concludes the write data packet has been input into the device. The sequence ends at step 595.

Figure 6:
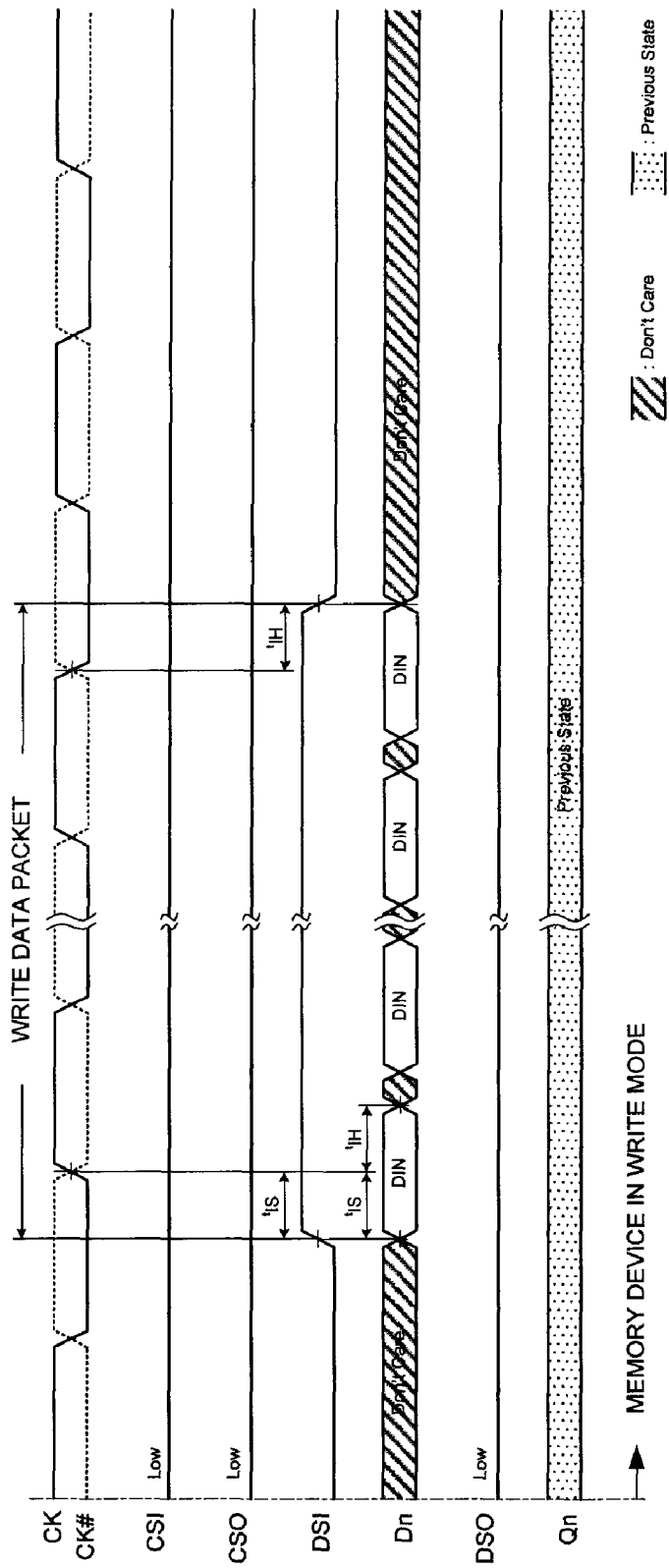
FIG. 6 is a timing diagram that illustrates timing information that may be used to input a write data packet into a memory device in accordance with an embodiment of the invention.

FIG. 6 is a timing diagram that illustrates timing information that may be used to input a write data packet into a memory device 200 in accordance with an embodiment of the invention. While the data strobe signal is activated at the device's DSI input, the portion of the data packet present at the device's Dn input is clocked into the device 200 at a clock edge associated with the clock signal present at the CK or CK# inputs. Subsequent portions of the write data packet are clocked into the device 200 at subsequent clock transitions. The number of bits of the write data packet that comprise the portion depends on the width of Dn, as noted above.

Time $'IS$ represents a setup time and time $'IH$ represents a hold time for the portion of the write data packet that is presented at the Dn input. The data strobe signal is activated for the duration of the write data packet and is used to delineate the write data packet. The data strobe signal is deactivated after the last portion of the write data packet has been clocked into the memory device 200.

Note that the write data packet is input into the memory device 200 while the device 200 is in a write mode. The memory device 200 enters the write mode in response to executing a command (e.g., a burst data load start command, a burst data load command). The write mode is a mode where the memory device 200 is configured to (1) receive (input) a write data packet via the device's Dn input and (2) transfer write data contained in the write data packet to the page buffer 217. While the device 200 is in the write mode, the DSO and Qn outputs are configured to maintain a steady state and not be affected by the state of the write data packet while it is input into the device 200. This acts to conserve power since the DSO and Qn are not actively changing state and thus are not consuming additional power. The device 200 exits the write mode by executing another command (e.g., a page program command) contained in another command packet that is later input into the device 200.

Figure 7:
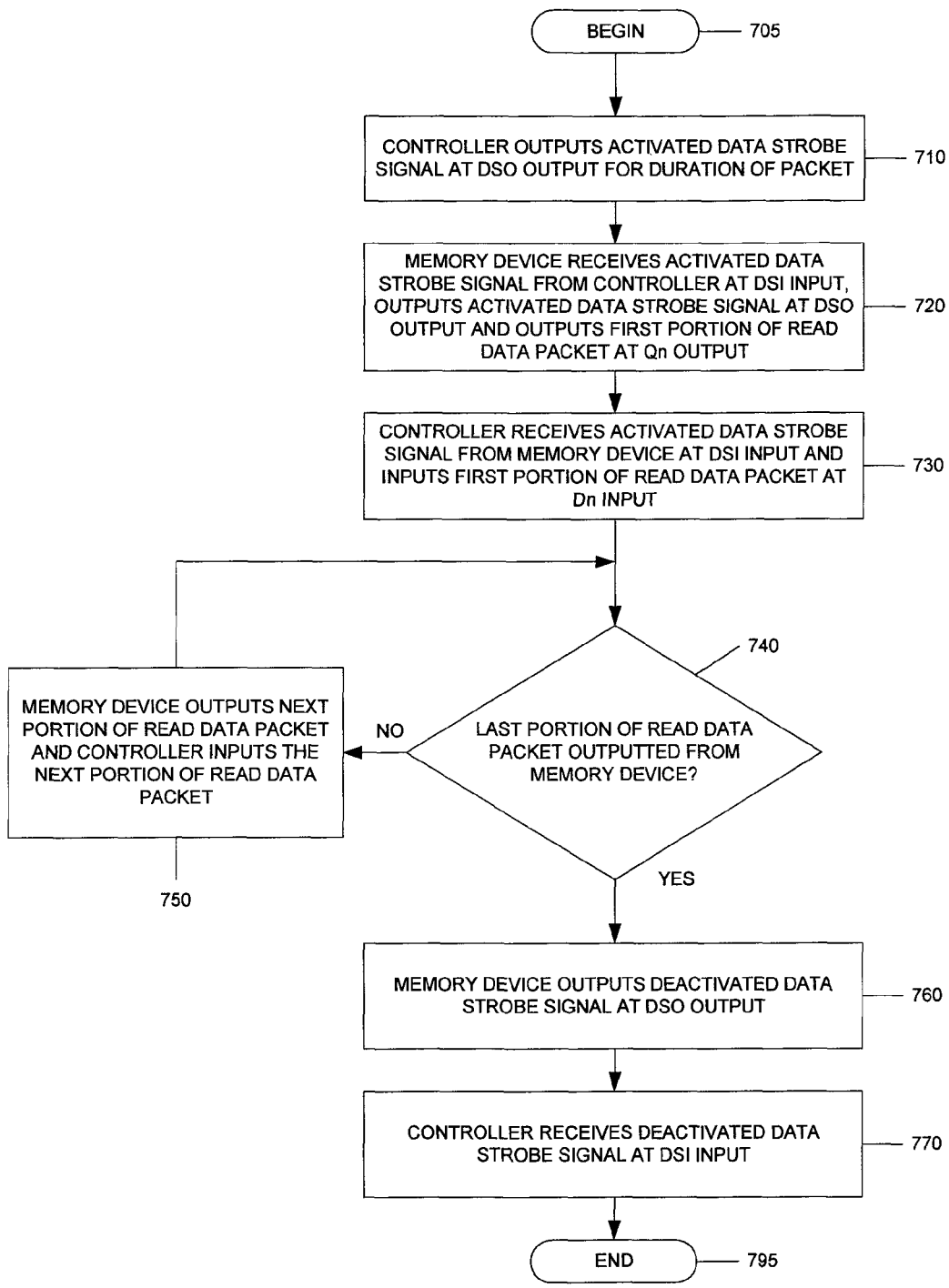
FIG. 7 is a flow chart of a sequence of steps that may be used to output a read data packet from a memory device in accordance with an embodiment of the invention.

FIG. 7 is a flow chart of a sequence of steps that may be used to output a read data packet from the memory device 200 in system 100 in accordance with an embodiment of the invention. Referring to FIGS. 1 and 7, the sequence begins at step 705 and proceeds to step 710 where the controller 110 requests the read data packet from the device by outputting an activated data strobe signal for the length of the read data packet at the controller's DSO output. The activated data strobe signal delineates the requested read data packet. At step 720, memory device 200 receives the activated data strobe signal at the device's DSI input, outputs a copy of the activated data strobe signal at the device's DSO output and outputs a first portion of the data packet at the device's Qn output, as described above. At step 730, the controller 110 receives the copy of the activated data strobe signal from the device 200 at the controller's DSI input and clocks in the first portion of the read data packet at the controller's Dn input at a transition of a clock signal present at the controller's CK or CK# input.

At step 740, the memory device 200 determines if a last portion of the read data packet has been outputted from the memory device 200. If not, the sequence proceeds to step 750 where the memory device 200 outputs the next portion of the read data packet and the controller 110 inputs this next portion of the read data packet into the controller 110, as described above. The sequence then returns to step 740.

If at step 740, the memory device 200 determines that the last portion of the read data packet has been outputted by the memory device 200, the sequence proceeds to step 760 where the memory device 200 outputs a deactivated data strobe signal at its DSO output. At step 770, the controller 110 receives the deactivated data strobe signal at its DSI input and concludes the read data packet has been outputted from the device 200. The sequence ends at step 795.

Figure 8:
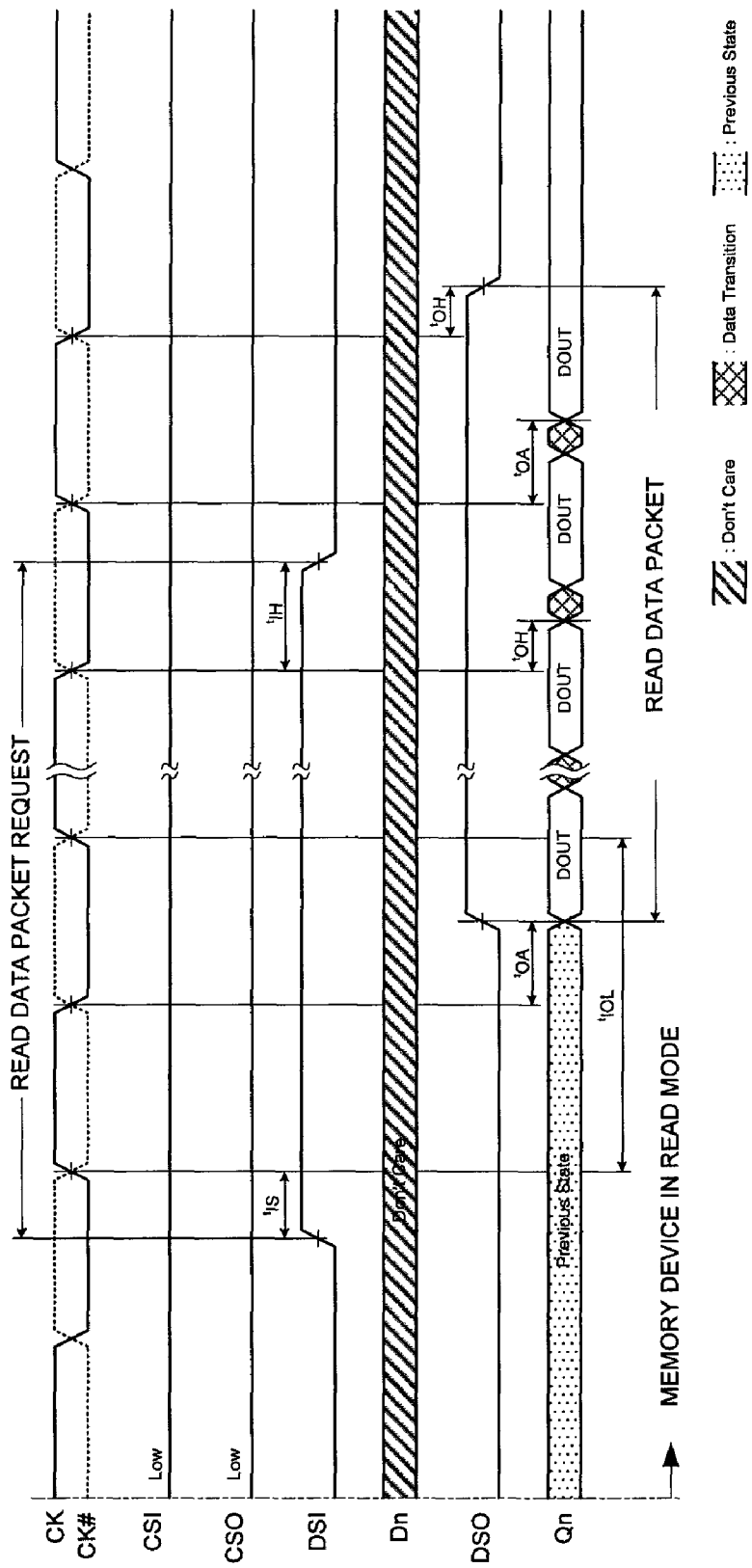
FIG. 8 is a timing diagram that illustrates timing information that may be used to output a read data packet from a memory device in accordance with an embodiment of the invention.

FIG. 8 is a timing diagram that illustrates timing information that may be used to output a read data packet from a memory device 200 in accordance with an embodiment of the invention. Referring to FIG. 8, a data strobe signal is activated and received by the device 200 at the device's DSI input, as described above. The time $'IS$ represents a setup time for the activated data strobe signal and the time $'IH$ represents a hold time for activated data strobe signal. The device 200 outputs a copy of the activated data strobe signal at the device's DSO output. The outputted data strobe signal is activated for the same duration as the received activated data strobe signal.

The read data packet is output from the device 200 while the copy of the activated data strobe signal is output from the device 200. Time $'OL$ is an output latency time that represents a time from when the activated data strobe signal was recognized by the device 200 to the time that a first portion of the read data packet is present at the device's Qn output. At each clock transition, a portion of the read data packet is presented at the device's Qn output. Time $'OA$ represents an output access time and time $'OH$ represents an output hold time for the portion of the read data packet that is presented at the device's Qn output.

Note that the read data packet is output from the device 200 while the device 200 is in a read mode. In an embodiment of the invention, the device 200 enters the read mode by executing a command, such as a burst data read command, and exits the read mode when another command is input into the device 200.

Figure 9A:
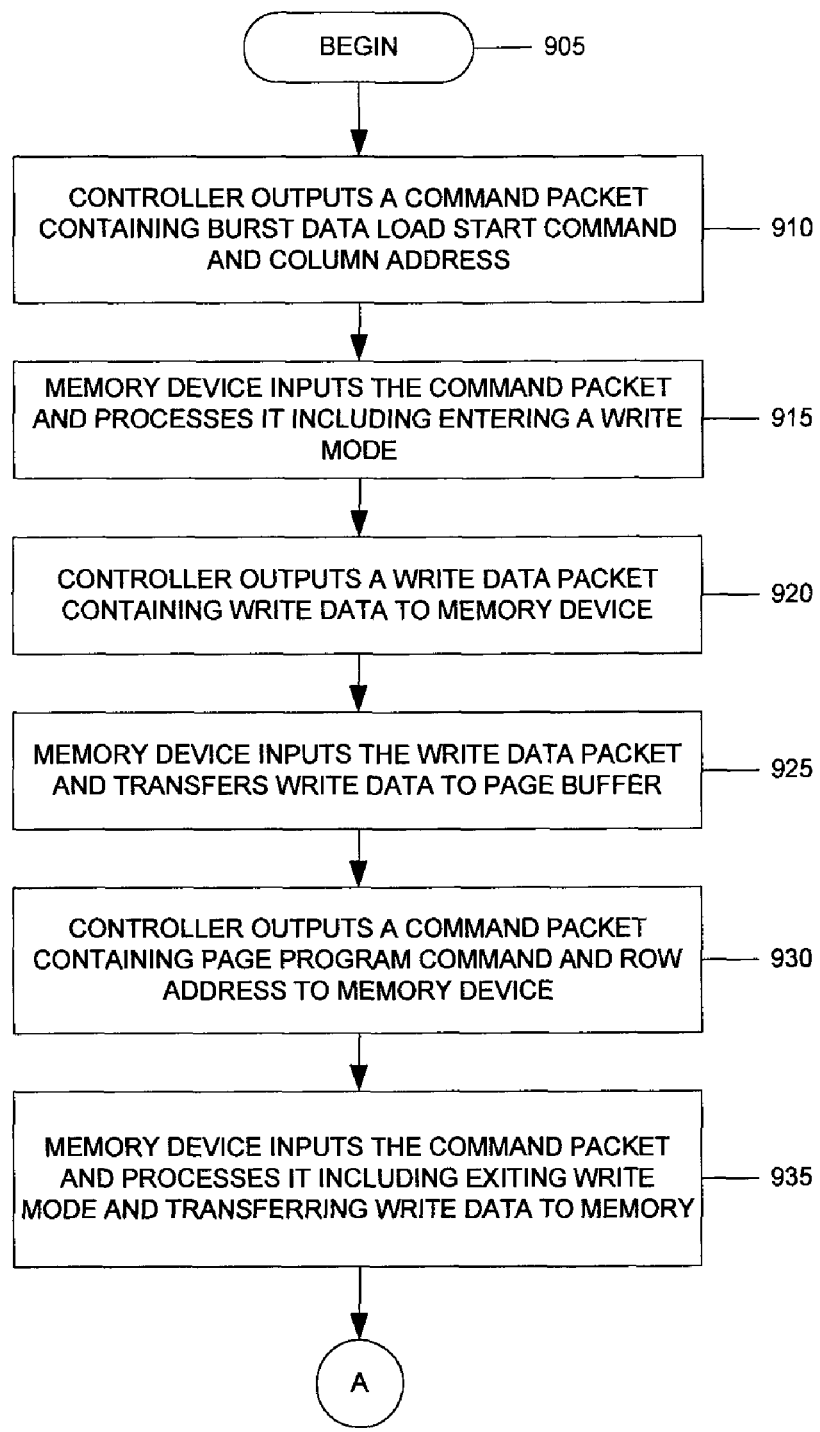
FIGS. 9A-B are a flow chart of a sequence of steps that may be used to store data in a memory device in accordance with an embodiment of the invention.
Figure 9B:
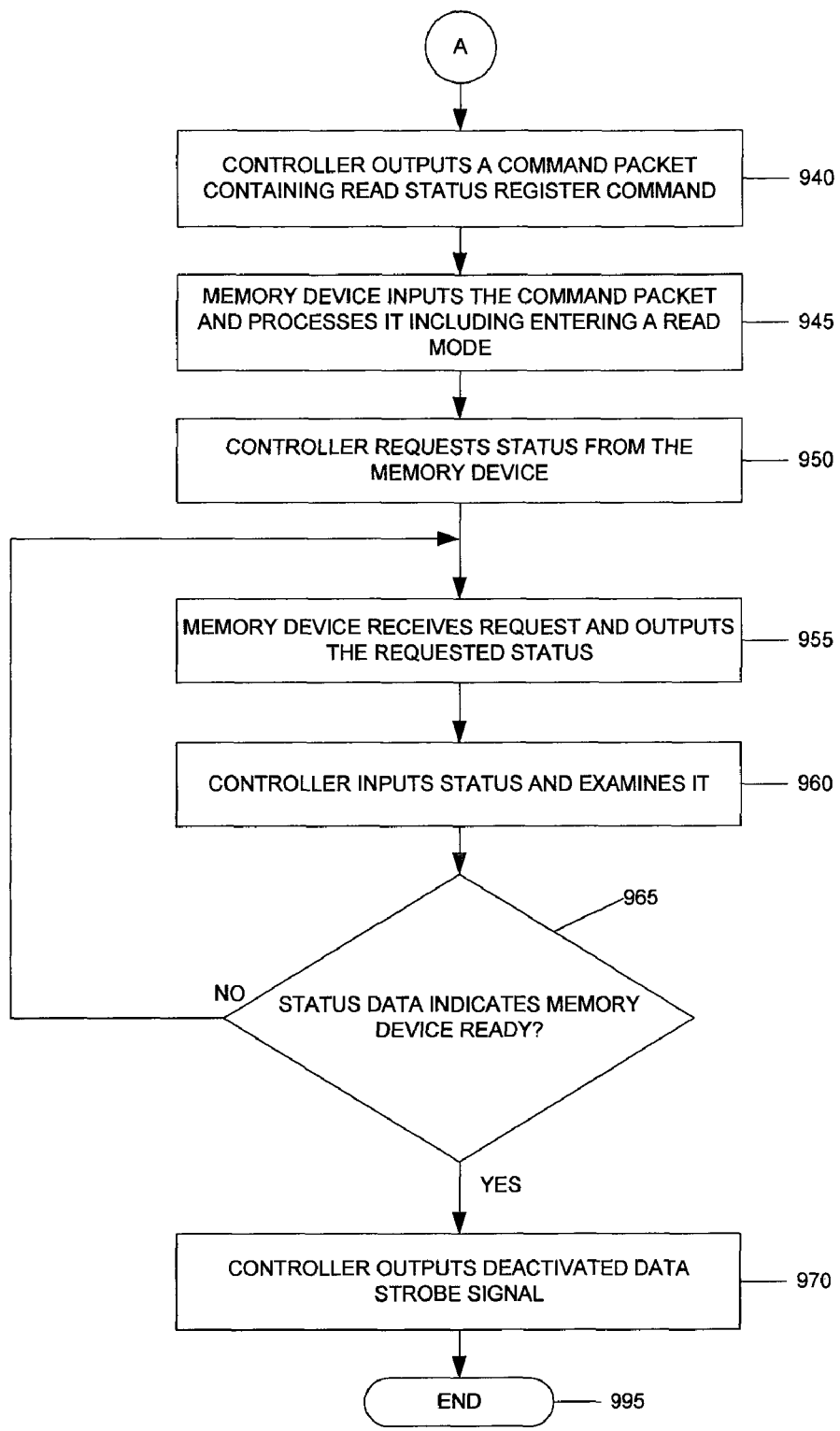

FIGS. 9A-B are a flow chart of a sequence of steps that may be used to store data in the memory device 200 in system 100 in accordance with an embodiment of an invention. Referring to FIGS. 1 and 9A-B, the sequence begins at step 905 and proceeds to step 910 where the controller 110 outputs a command packet containing a burst data load start command and a column address, as described above. At step 915, the memory device 200 inputs the command packet, as described above, and processes it including entering a write mode. At step 920, the controller 110 outputs a write data packet, containing data to be written into the device's memory 205, to the memory device 200, as described above. The memory device 200 inputs the write data packet, at step 925, as described above, and transfers write data contained in the write data packet to the device's page buffer 217 starting at the column address specified in the command packet.

At step 930, the controller 110 outputs a command packet containing a page program command and a row address. At step 935, the memory device 200 inputs the command packet, as described above, and processes it including transferring the contents of the page buffer to memory 205 starting at the location specified by the row address contained in the command packet.

At step 940 (FIG. 9B), the controller 110 outputs a command packet, containing a read status register command, to the memory device 200. The read status register command may be used to direct the device 200 to output a status of the device 200. At step 945, the memory device 200 inputs the command packet, as described above, and processes it including entering a read mode.

At step 950, the controller 110 requests the status from the device 200 by outputting an activated data strobe signal at its DSO output, as described above. At step 955, the device 200 receives the request (i.e., the activated data strobe signal) at its DSI input and outputs the requested status at its Qn output. At step 960, the controller 110 inputs the requested status at its Dn input.

At step 965, the controller 110 determines if the status indicates that the memory device 200 is ready. The memory device 200 outputs a status that indicates the device 200 is ready after it has completed writing the data to memory 205. If the status does not indicate that the device 200 is ready, the sequence returns to step 955. Otherwise, the sequence proceeds to step 970 where the controller 110 outputs a deactivated data strobe signal at its DSO output and concludes the data has been written into the device's memory 205. The sequence ends at step 995.

Figure 10:
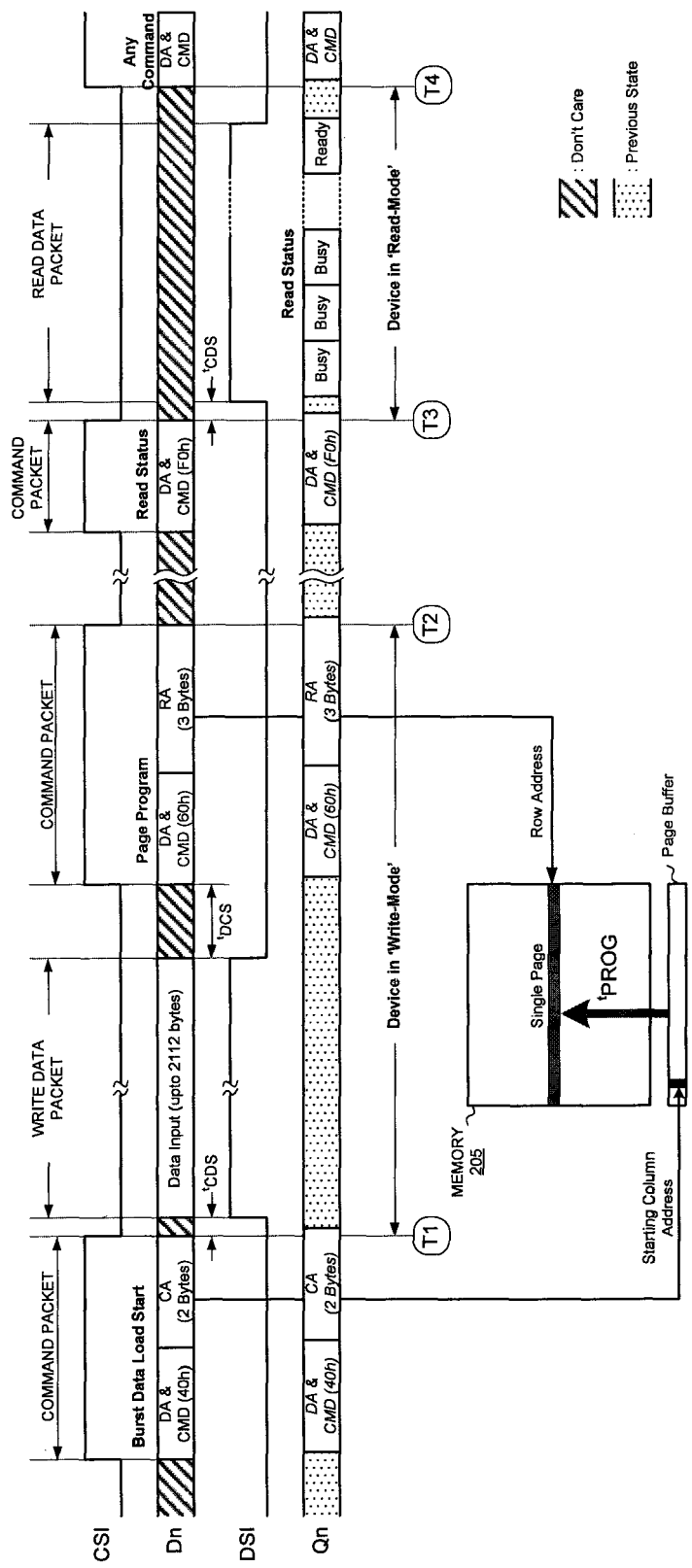
FIG. 10 is a timing diagram that illustrates timing information that may be used to store data in a memory device in accordance with an embodiment of the invention.

FIG. 10 is a timing diagram that illustrates timing information that may be used to store data into a memory device 200 in accordance with an embodiment of the invention. Referring to FIG. 10, a command packet, that is addressed to the device 200 and contains a burst data load start command and a column address, is inputted into the device 200, as described above. The column address indicates a starting address in the device's page buffer 217 where the data is to be written. Since the command packet is addressed to the device 200, the device 200 processes the command and enters a write mode which is designated in the timing diagram as time T1 through T2.

An activated data strobe signal is input into the device 200 at the device's DSI input at a time $^t$CDS which is a CSI to DSI separation time and a write data packet, containing the data to be written into the device's memory 205, is inputted into the device 200 at the device's Dn input, as described above. The data contained in the write data packet is placed in the device's page buffer 217 starting at the starting column address specified in the command packet. Afterwards, a command packet, containing the device's device address, a page program command and a row address, is input into the device 200, as described above. The command packet is inputted into the device 200 after a time interval $^t$DCS which is a DSI to CSI separation time. The page program command directs the device 200 to write the data contained in the page buffer 217 into the device's memory 205 starting at the row address contained in the command packet.

A command packet, containing a read status command, is then input into device 200, as described above. The read status command causes the device 200 to enter a read mode (designated in the diagram as time T3 through T4) and output the status of the device 200 (e.g., busy, ready) at the device's Qn output. An activated data strobe signal is input into the device 200 at the device's DSI input, as described above, to request that the device 200 output the status. The data strobe signal is activated after a time $^t$CDS which is a CSI to DSI separation time. While device 200 is busy writing the data into memory 205, the device 200 reports a busy status at the device's Qn output. After the device 200 has finished writing the data into memory 205, the device 200 reports a ready status at the device's Qn output. After the device reports a ready status, the data strobe signal that is input into the device's DSI input is deactivated. The next command that is inputted into the device 200 causes the device to exit the read mode.

Figure 11A:
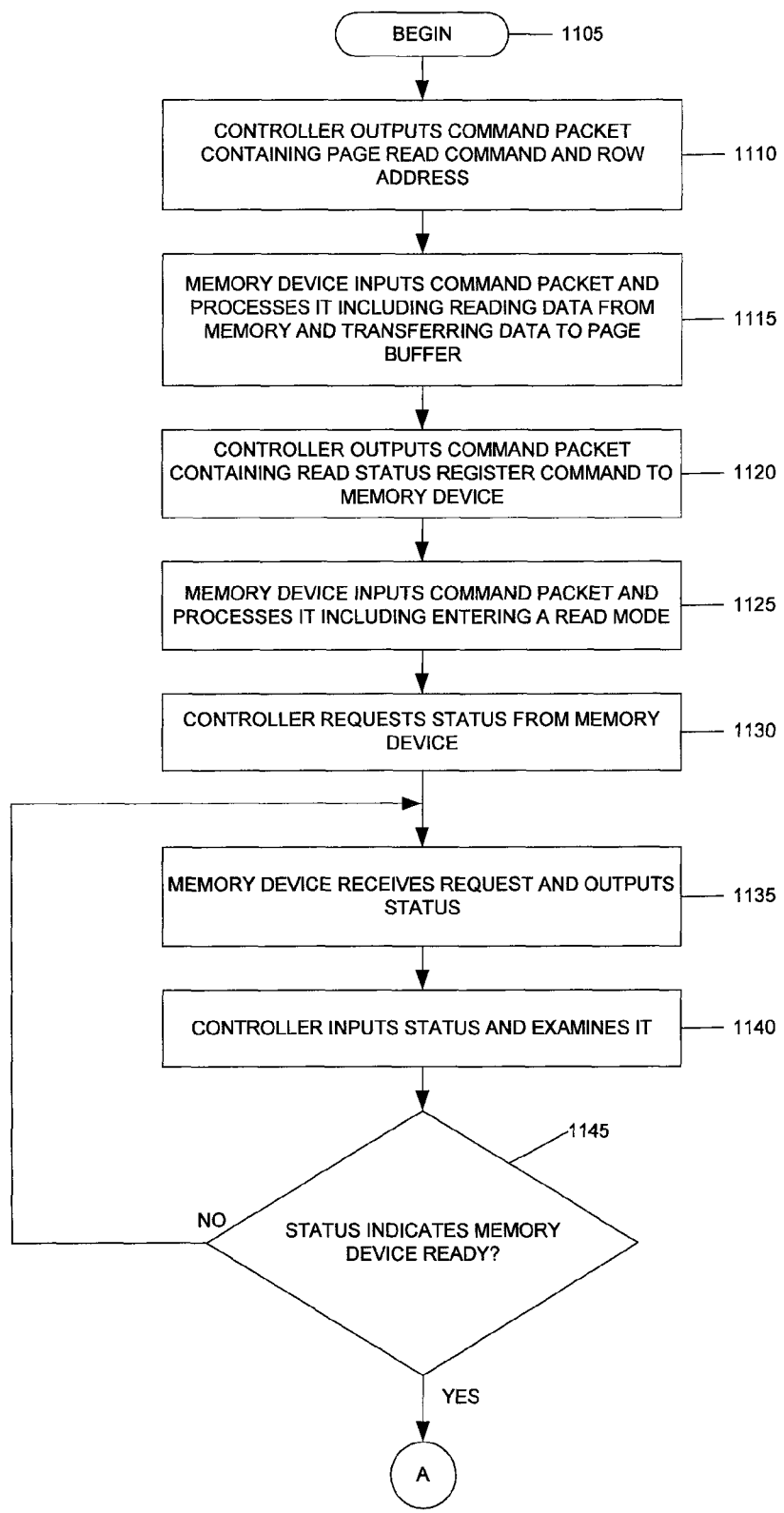
FIGS. 11A-B are a flow chart of a sequence of steps that may be used to retrieve data from a memory device in accordance with an embodiment of the invention.
Figure 11B:
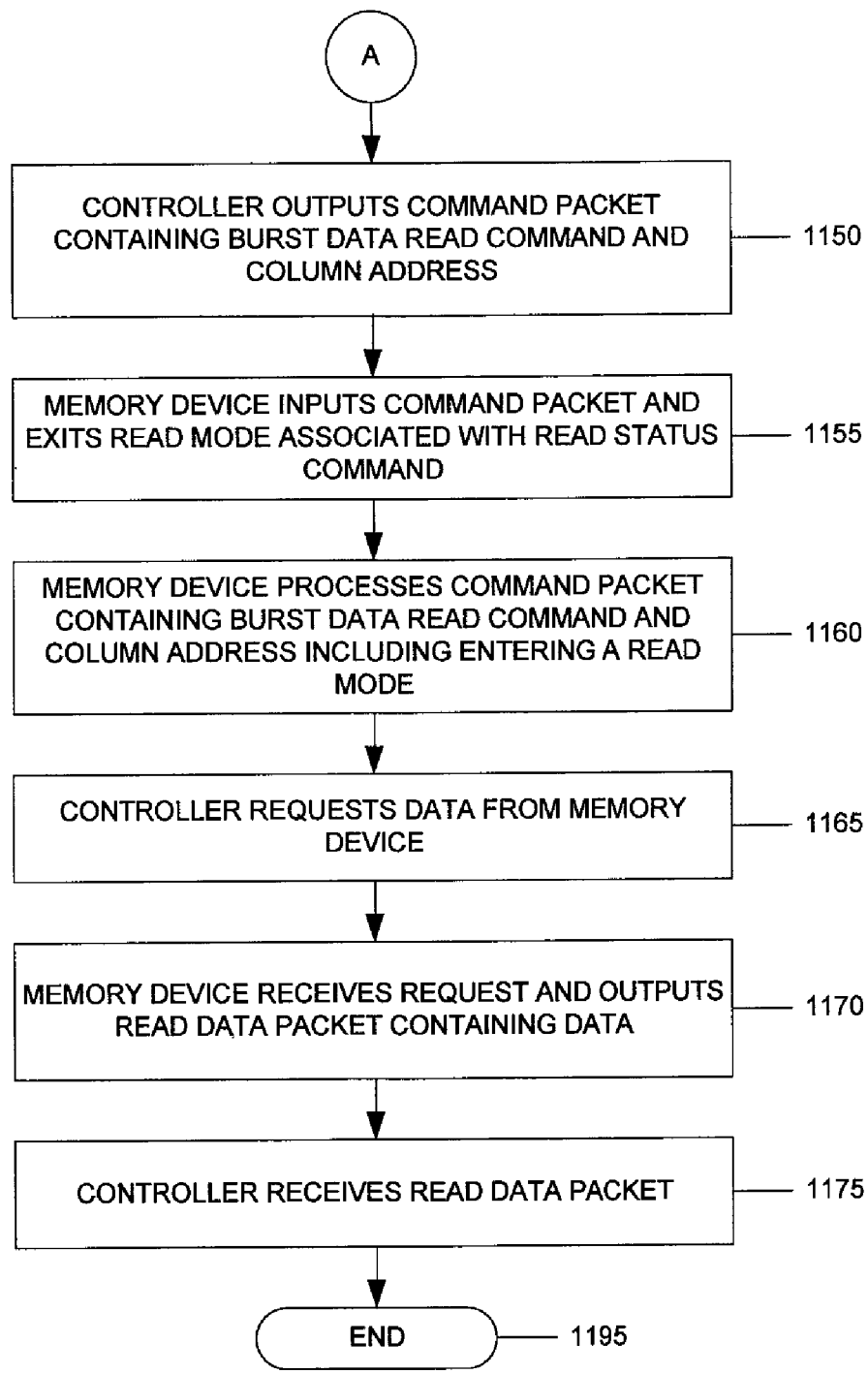

FIGS. 11A-B are a flow chart of a sequence of steps that may be used to retrieve data from the memory device 200 in system 100 in accordance with an embodiment of the invention. Referring to FIGS. 1 and 11A-B, the sequence begins at step 1105 and proceeds to step 1110 where the controller 110 outputs a command packet containing a page read command and a row address. At step 1115, the memory device 200 inputs the command packet, as described above, and processes it including retrieving data from memory 205, starting at the row address contained in the command packet, and transferring the retrieved data to the device's page buffer 217.

At step 1120, the controller 110 outputs a command packet containing a read status command. At step 1125, the memory device 200 inputs the command packet, as described above, and processes it including entering a read mode. At step 1130, the controller 110 requests the status of the device, as described above. At step 1135, the memory device 200 receives the request and outputs the status at the device's Qn output, as described above. At step 1140, the controller 110 inputs the status and examines it.

At step 1145, the controller 110 determines if the status indicates the device 200 is ready. The device 200 indicates a ready status after it has completed the page read command. If the status does not indicate the device 200 is ready, the sequence returns to step 1135; otherwise, the sequence proceeds to step 1150 (FIG. 11B) where the controller 110 outputs a command packet containing a burst data read command and a column address.

At step 1155, the memory device 200 inputs the command packet containing the burst data read command and column address, as described above, and exits the read mode associated with the read status command. The memory device 200, at step 1160, processes the command packet, containing the burst data read command and column address, including entering a read mode (associated with the burst data read command) and retrieving the data from the page buffer 217 starting at the column address specified in the command packet. At step 1165, the controller 110 requests data from the memory device 200 by outputting an activated data strobe signal, as described above. At step 1170, the memory device 200 receives the request and outputs a read data packet, containing the retrieved data, to the controller 110, as described above. The controller 110, at step 1175, receives the read data packet containing the retrieved data. The sequence ends at step 1195.

Figure 12:
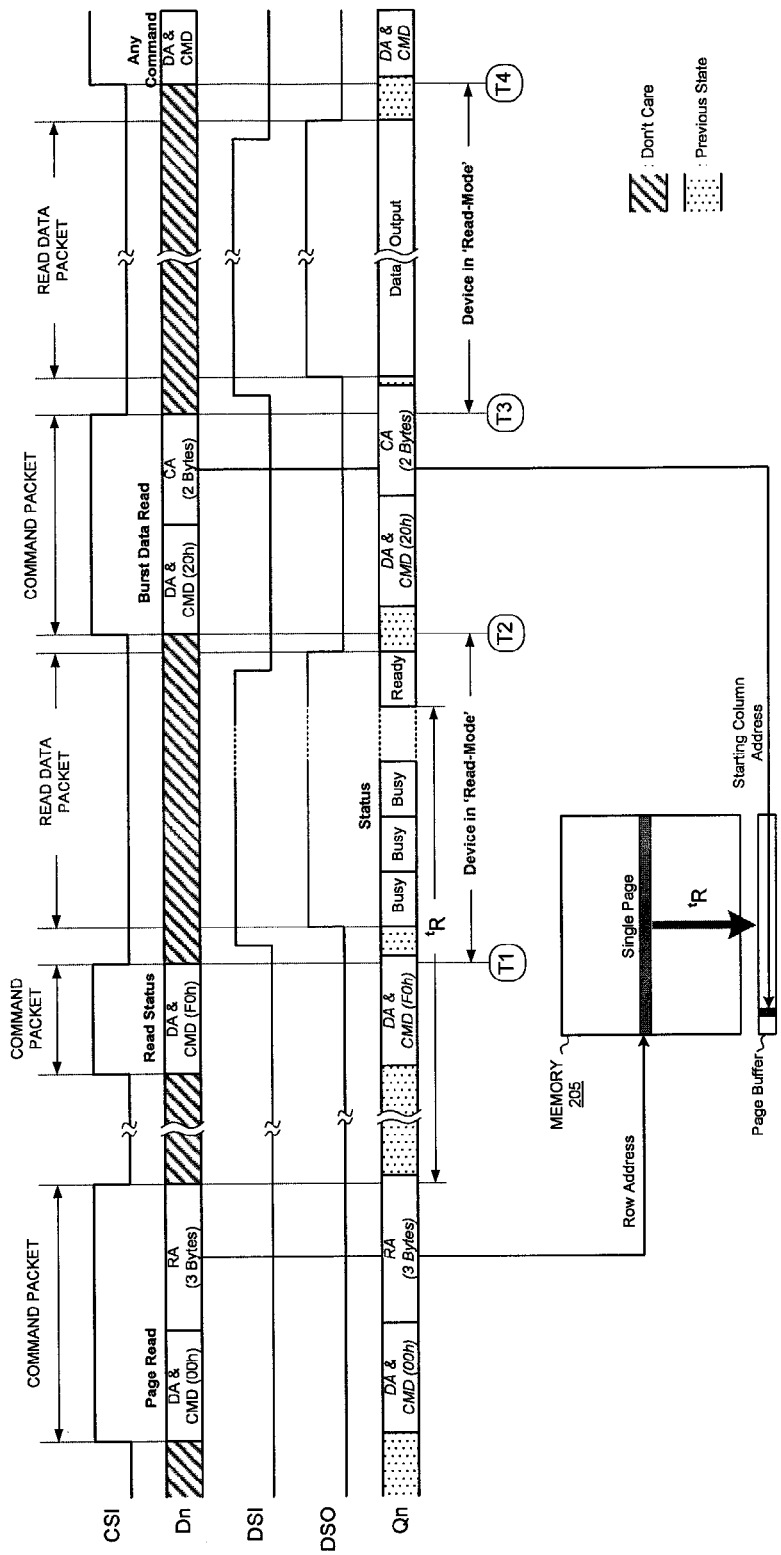
FIG. 12 is a timing diagram that illustrates timing information that may be used to retrieve data from a memory device in accordance with an embodiment of the invention.

FIG. 12 is a timing diagram that illustrates timing information that may be used to retrieve data from a memory device 200 in accordance with an embodiment of the invention. An activated command strobe signal is input into the device 200 at the device's CSI input and a command packet, containing a page read command and a row address, is input into the device 200 at the device's Dn input, as described above. The row address is used to select a page in memory 205 that contains the data that is retrieved. The device 200 processes the command packet including retrieving the data from memory 205 starting at a page indicated by the row address and transferring the data to the device's page buffer 217.

A command packet, containing a read status command, is then input into the device 200, as described above. The device 200 enters a read mode (illustrated in the timing diagram as the time T1 to T2) and outputs the status of the device 200 (e.g., busy, ready) at the device's Qn output, as described above. While the device 200 is busy reading data from memory 205, the device 200 reports a busy status at the device's Qn output. Time $^t$R indicates a time where data is being read from memory 205 and transferred to the device's page buffer 217. After the device 200 has finished reading the data from memory 205 and transferring the data to the page buffer 217, the device 200 reports a ready status at the device's Qn output.

A command packet, containing a burst data read command and a column address, is then input into the device 200, as described above. Note that the read mode associated with the read status command is exited at the time an activated CSI signal is input into the device 200. The burst data read command places the device 200 into a read mode, associated with the burst data read command, (illustrated in the diagram the time T3 to T4) and causes data contained in the page buffer 217 to be output from the device 200. The column address contained in the command packet represents a starting address in the page buffer 217 where data is read. An activated data strobe signal is then received by the device 200 at the device's DSI input and, (1) the device 200 outputs the received activated data strobe signal at the device's DSO output and (2) outputs a read data packet, containing the data, at the device's Qn output, as described above. A successive command packet that is input into the device 200 causes the device to exit the read mode associated with the burst data read command.

Figure 13A:
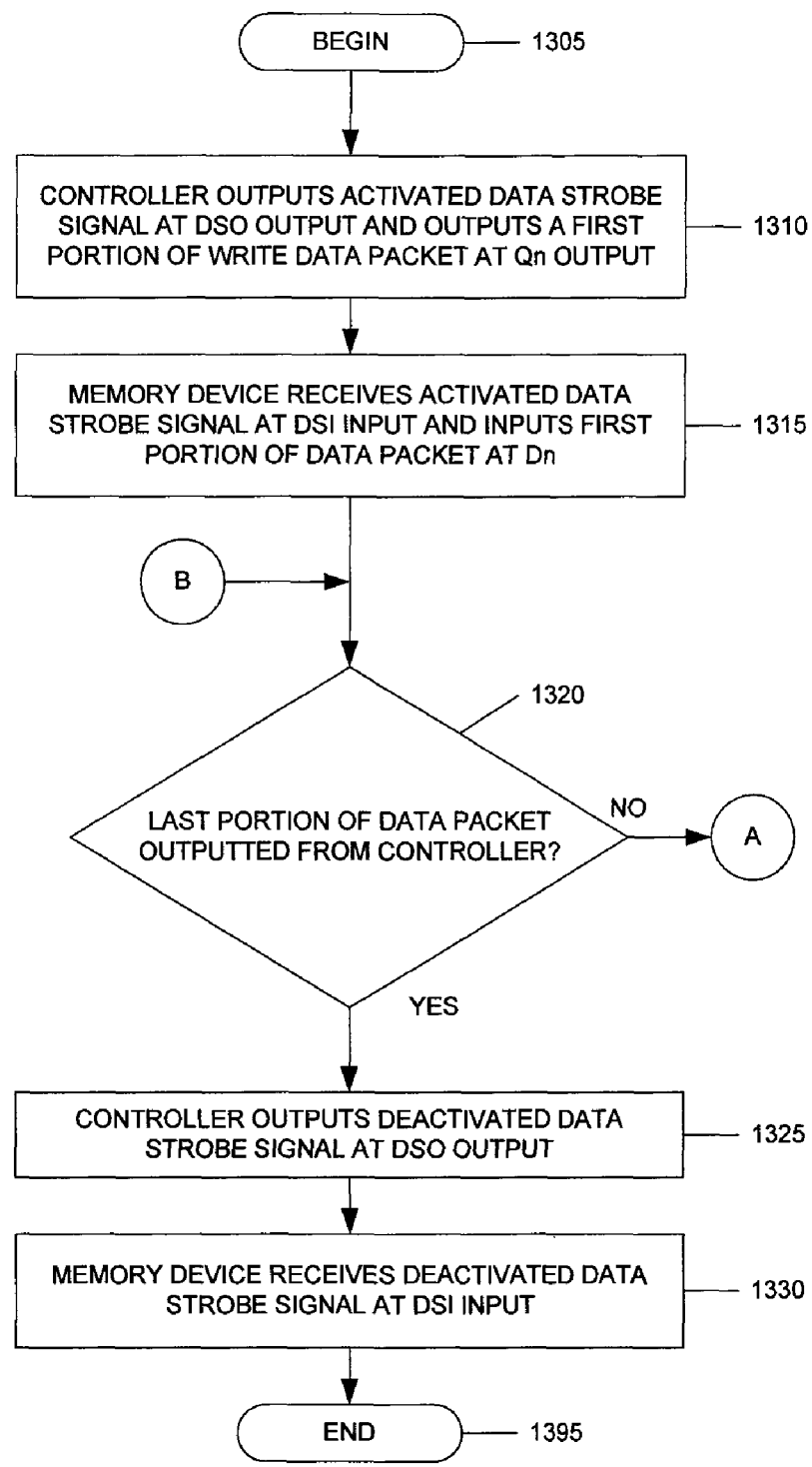
FIGS. 13A-B are a flow chart of a sequence of steps that may be used to pause and resume the inputting of a write data packet into a memory device in accordance with an embodiment of the invention.
Figure 13B:
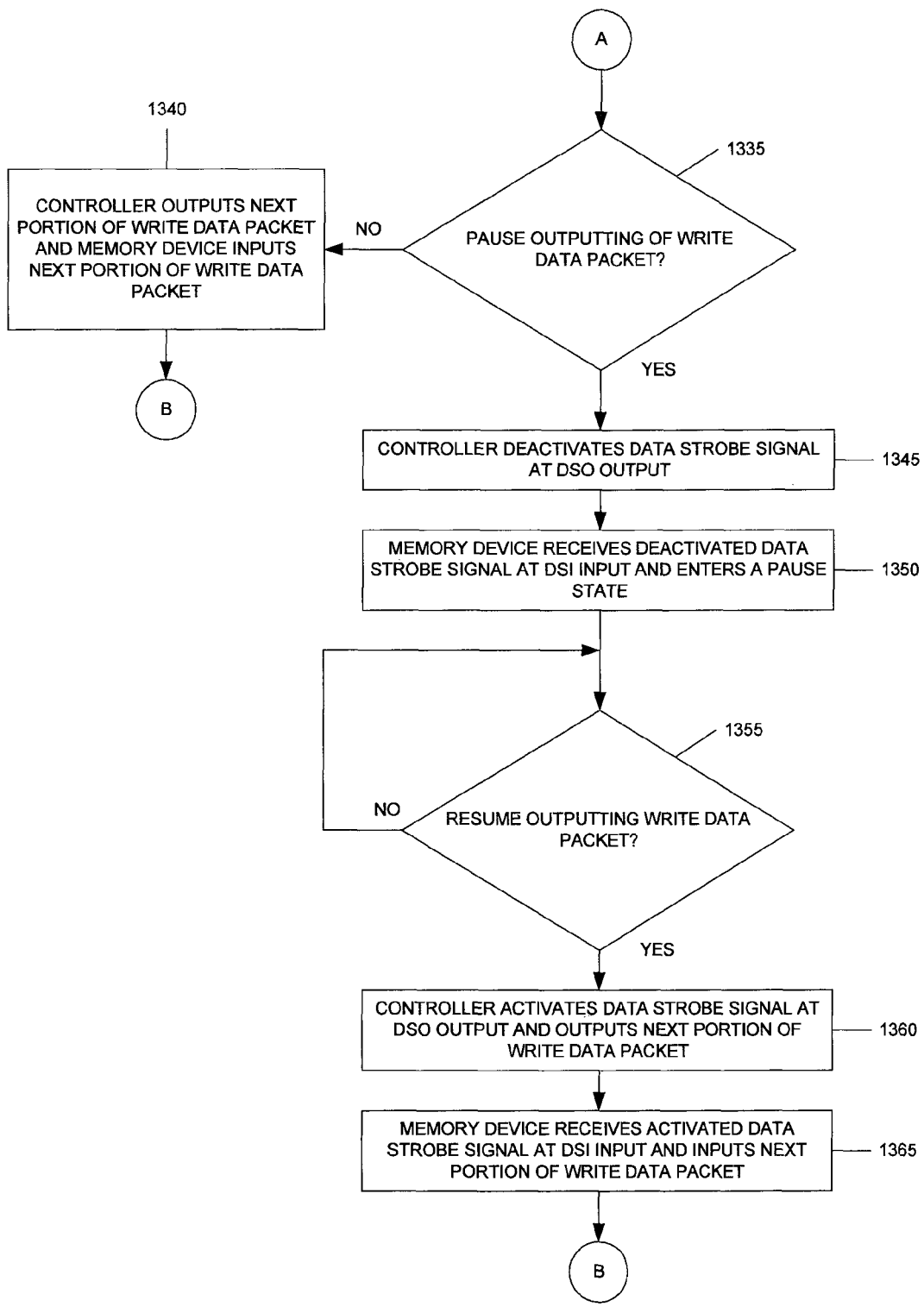

FIGS. 13A-B are a flow chart of a sequence of steps that may be used to pause and resume the inputting of a write data packet into the memory device 200 in system 100 in accordance with an embodiment of the invention. The sequence begins at step 1305 and proceeds to step 1310 where the controller 110 outputs an activated data strobe signal at the controller's DSO output and outputs a first portion of the write data packet to the memory device 200, as described above. At step 1315, the memory device 200 receives the activated data strobe signal at its DSI input and inputs the first portion of the data packet into the device 200, as described above.

At step 1320, the controller 110 determines if a last portion of the data packet has been outputted from the controller 110. If so, the sequence proceeds to step 1325 where the controller 110 deactivates the outputted data strobe signal and step 1330 where the memory device 200 receives the deactivated data strobe signal and concludes the data packet has been inputted into the memory device 200. The sequence ends at step 1395.

If at step 1320, the controller 110 determines that the last portion of the write data packet has not been outputted from the controller 110, the sequence proceeds to step 1335 (FIG. 13B) where the controller 110 determines if it should pause outputting the write data packet. If not, the sequence proceeds to step 1340 where the controller 110 outputs the next portion of the write data packet to the memory device 200 and the next portion is inputted into the memory device 200, as described above. The sequence then returns to step 1320.

If at step 1335 the controller 110 determines that it should pause outputting the write data packet, the sequence proceeds to step 1345 where the controller 110 deactivates the data strobe signal outputted at its DSO output. At step 1350, the device 200 receives the deactivated data strobe signal at its DSI input and enters a pause state. While in the pause state, the device 200 pauses inputting the write data packet at its Dn input.

At step 1355, the controller 110 determines if it should resume outputting the write data packet to the memory device 200. If not, the sequence returns to step 1355. Otherwise, the sequence proceeds to step 1360 where the controller 110 outputs an activated data strobe signal at its DSO output and outputs the next portion of the write data packet at its Qn output, as described above. At step 1365, the memory device 200 receives the activated data strobe signal at its DSI input and inputs the next portion of the write data packet into the device 200, as described above. The sequence then returns to step 1320.

Figure 14:
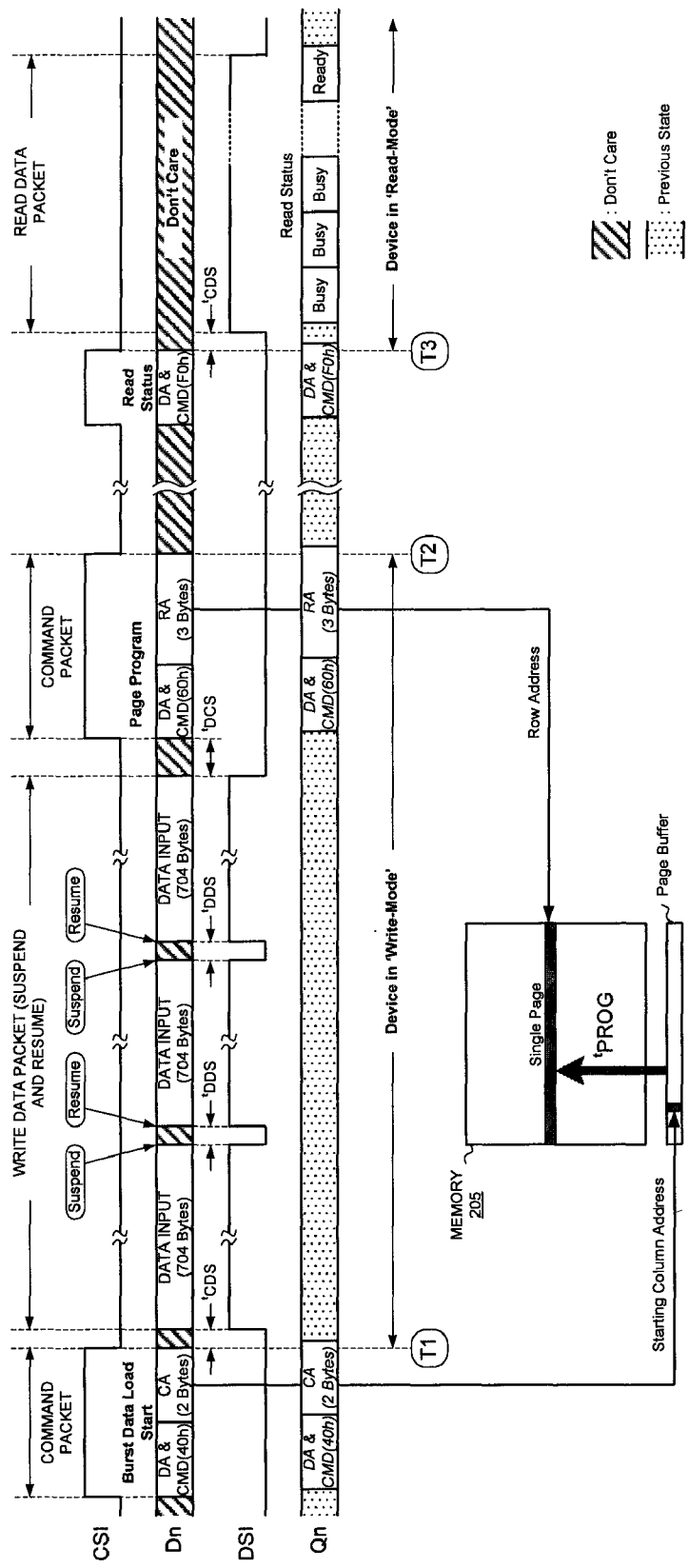
FIG. 14 is a timing diagram that illustrates timing information that may be used to pause and resume the inputting of a write data packet into a memory device in accordance with an embodiment of the invention.

FIG. 14 is a timing diagram that illustrates timing information that may be used to pause and resume the inputting of a write data packet into a memory device 200 in accordance with an embodiment of the invention. Note that the timing diagram illustrates an example of timing information associated with inputting a 2112 byte data packet into the device 200 in three 704-byte bursts where the first 704 bytes of the data packet is inputted in the first burst, the second 704-bytes of the data packet is inputted in the second burst and the third 704 bytes of the data packet in inputted in the third burst.

Referring to FIG. 14, a command packet, containing a burst data load start command and a column address, is inputted into the device 200, as described above. The device 200 processes the command packet including entering a write mode which is indicated in the diagram as time T1 to T2. An activated data strobe signal is then input into the device 200 at the device's DSI input, the first 704 bytes of the write data packet are input into device 200 and transferred to the device's page buffer 217, as described above. Afterwards, the data strobe signal is deactivated to suspend inputting the write data packet into the device 200. Later, the data strobe signal is reactivated and the next 704 bytes of the write data packet are inputted into the device 200 and transferred to the device's page buffer 217, as described above. Again, the data strobe signal is deactivated to suspend inputting the write data packet into the device 200. Afterwards, the data strobe signal is reactivated and the remaining 704 bytes of the write data packet are inputted into the device 200 and transferred to the device's page buffer 217, as described above.

A command packet containing a page program command is then input into the device 200, as described above, to direct the device 200 to write the data in the page buffer 217 into the device's memory 205. Likewise, a command packet, containing a read status command, is input into the device 200, as described above, to acquire the device's status and determine if the device 200 is ready. The device 200 reports a ready status after the page program operation has completed. The page program operation completes when the data is written into the device's memory 205.

While the present invention has been shown and described herein with reference to specific embodiments thereof, it should be understood by those skilled in the art that variations, alterations, changes in form and detail, and equivalents may be made or conceived of without departing from the spirit and scope of the invention.

What is claimed is:
1. A device comprising:
   memory;
   a first serial data link to serially input one or more packets into the device;
   a first memory device input to input a command strobe signal into the device, the command strobe signal delineating a first packet that is serially inputted into the device at the first serial data link, the first packet including a command, executable by the device, and associated with a write mode of device operation;
   a second memory device input to input a data strobe signal into the device, the data strobe signal delineating a second packet that is serially inputted into the device at the first serial data link, the second packet including write data; and
   circuitry to store the write data in the memory in response to the command.

2. The device as defined in claim 1 further comprising:
   a memory device output to output the command strobe signal from the device.

3. The device as defined in claim 2 further comprising:
   a second serial data link to output the first packet from the device while the command strobe signal is output from the device at the memory device output.

4. The device as defined in claim 1 further comprising:
   a memory device output to output the data strobe signal from the device.

5. The device as defined in claim 4 further comprising:
a second serial data link to output the second packet from the device while the data strobe signal is outputted from the device at the memory device output.

6. The device as defined in claim 5, wherein the memory device output and the second serial data link maintain a steady state while the second packet is input into the device via the first serial data link.

7. The device as defined in claim 1 further comprising:
link configuration circuitry to establish a width of the first serial data link.

8. The device as defined in claim 1 further comprising:
a data buffer to buffer the write data before it is stored in the memory.

9. The device as defined in claim 1, wherein the device enters a write mode in response to executing the command, the write mode configuring the device to receive the second packet into the device via the first serial data link.

10. The device as defined in claim 9, wherein the one or more packets includes a third packet, and a second command strobe signal is inputted into the device at the first memory device input while the third packet is received at the first serial data link, the third packet including a command that is executed by the device and wherein the device exits the write mode in response to executing the command included in the third packet.

11. The device as defined in claim 9 further comprising:
a data buffer to hold data that is to be stored in the memory; and
circuitry to transfer the write data in the second packet to the data buffer in response to the device being in the write mode.

12. The device as defined in claim 1, wherein the first packet comprises a device address that is associated with the device, the device address being used to address the first packet to the device.

13. A method comprising:
inputting an activated command strobe signal into a memory device at a first input of the memory device, the activated command strobe signal delineating a first packet that is serially inputted into the memory device at a first serial data link of the memory device, the first packet including a command, executable by the memory device, and associated with a write mode of device operation;
inputting an activated data strobe signal into the memory device at a second input of the memory device, the activated data strobe signal delineating a second packet that is serially inputted into the memory device at the first serial data link, the second packet including write data; and
storing the write data in memory.

14. The method as defined in claim 13 further comprising:
outputting the activated command strobe signal from the memory device at an output of the memory device.

15. The method as defined in claim 14 further comprising:
outputting the first data packet from the memory device at a second serial data link of the memory device while the activated command strobe signal is outputted from the memory device at the output.

16. The method as defined in claim 13 further comprising:
outputting the activated data strobe signal from the memory device at an output of the memory device.

17. The method as defined in claim 16 further comprising:
outputting the second packet from the memory device at a second serial data link of the memory device while the activated command strobe signal is output from the memory device at the output.

18. The method as defined in claim 17 further comprising:
maintaining the output and second serial data link at a steady state while the second packet is input into the memory device via the first serial data link.

19. The method as defined in claim 13, wherein the data strobe signal is deactivated at the second input to suspend inputting the second packet at the first serial data link.

20. The method as defined in claim 19, wherein the data strobe signal is reactivated at the second input to resume inputting the second packet at the first serial data link.

21. The device as in claim 1, wherein the command strobe signal delineates boundaries of a sequence of multiple serially transmitted bits in the first packet; and
wherein the data strobe signal delineates boundaries of a sequence of multiple serially transmitted bits in the second packet.

22. The device as in claim 1 further comprising a clock input to input a clock signal, and wherein the device is a synchronous device.

23. The device as in claim 1, wherein the first serial data link is a single serial link on which sequential bits in the first packet and sequential bits in the second packet are transmitted.

24. The device as in claim 1, wherein the first packet is a first multi-bit packet of bits that are serially transmitted over the first serial data link; and
wherein the second packet is a second multi-bit packet of bits that are serially transmitted over the first serial data link.

25. The device as in claim 1, further comprising a clock input to input a clock signal, and wherein each of the one or more packets is synchronously inputted into the device.

26. The device as in claim 1 further comprising:
a processor to de-serialize, based at least in part on the command strobe signal and the data strobe signal, bits in the first packet and bits in the second packet subsequent to transmission of the first packet and the second packet over the first serial data link.

27. The device as in claim 1, further comprising an input and output data processing unit to de-serialize the second packet.

28. The device as in claim 1, wherein the command strobe signal delineates a length of the first packet; and
wherein the data strobe signal delineates a length of the second packet.

* * * * *